US010559664B2

(12) United States Patent
Iguchi et al.

(10) Patent No.: US 10,559,664 B2
(45) Date of Patent: Feb. 11, 2020

(54) METHOD OF MANUFACTURING SEMICONDUCTOR DEVICE BY REMOVING A BULK LAYER TO EXPOSE AN EPITAXIAL-GROWTH LAYER AND BY REMOVING PORTIONS OF A SUPPORTING-SUBSTRATE TO EXPOSE PORTIONS OF THE EPITAXIAL-GROWTH LAYER

(71) Applicant: FUJI ELECTRIC CO., LTD., Kawasaki-shi, Kanagawa (JP)

(72) Inventors: Kenichi Iguchi, Matsumoto (JP); Haruo Nakazawa, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/445,001

(22) Filed: Feb. 28, 2017

(65) Prior Publication Data

US 2017/0278931 A1 Sep. 28, 2017

(30) Foreign Application Priority Data

Mar. 22, 2016 (JP) .................................. 2016-056559

(51) Int. Cl.
*H01L 29/16* (2006.01)
*H01L 21/78* (2006.01)
(Continued)

(52) U.S. Cl.
CPC ...... *H01L 29/1608* (2013.01); *H01L 21/0485* (2013.01); *H01L 21/6835* (2013.01);
(Continued)

(58) Field of Classification Search
CPC .......... H01L 21/78; H01L 2221/68327; H01L 21/6835; H01L 2221/68381; H01L 21/0485; H01L 29/45; H01L 29/1608
See application file for complete search history.

(56) References Cited

U.S. PATENT DOCUMENTS 8,039,276 B2 10/2011 Amada et al.
8,153,452 B2 4/2012 Amada et al.
(Continued)

FOREIGN PATENT DOCUMENTS

JP 2002-76326 3/2002
JP 2002076326 * 3/2002 ............ H01L 29/41
(Continued)

OTHER PUBLICATIONS

Japanese Office Action dated Sep. 17, 2019 from Japanese Patent Application No. 2016-056559, 8 pages.
(Continued)

*Primary Examiner* — Erik Kielin

(57) ABSTRACT

A method of manufacturing a semiconductor device includes assigning a plurality of chip regions on an epitaxial-growth layer of a semiconductor substrate where the epitaxial-growth layer is grown on a bulk layer and forming a plurality of device structures on the plurality of chip regions, respectively, thinning the semiconductor substrate from a bottom-surface side of the bulk layer, bonding a supporting-substrate on a bottom surface of the thinned semiconductor substrate, selectively removing the supporting-substrate so that the bottom surface of the semiconductor substrate is exposed, at locations corresponding to positions of each of main current paths in the plurality of device structures, respectively, dicing the semiconductor substrate together with the supporting-substrate along dicing lanes between the plurality of the chip regions so as to form a plurality of chips.

19 Claims, 18 Drawing Sheets

(51) Int. Cl.
*H01L 21/683* (2006.01)
*H01L 21/04* (2006.01)
*H01L 29/45* (2006.01)
*H01L 29/66* (2006.01)

(52) U.S. Cl.
CPC .............. *H01L 21/78* (2013.01); *H01L 29/45* (2013.01); *H01L 29/66068* (2013.01); *H01L 2221/68327* (2013.01); *H01L 2221/68381* (2013.01)

(56) References Cited

U.S. PATENT DOCUMENTS

| | | | | |
|---|---|---|---|---|
| 8,536,709 | B1* | 9/2013 | Hsu | H01L 22/14 257/764 |
| 8,624,358 | B2 | 1/2014 | Yamazaki | |
| 8,866,150 | B2 | 10/2014 | Das et al. | |
| 10,230,007 | B2 | 3/2019 | Sasaki et al. | |
| 2004/0009649 | A1* | 1/2004 | Kub | B82Y 30/00 438/459 |
| 2005/0242369 | A1* | 11/2005 | Udrea | H01L 21/764 257/107 |
| 2008/0296771 | A1* | 12/2008 | Das | H01L 21/0475 257/758 |
| 2010/0267175 | A1 | 10/2010 | Amada et al. | |
| 2012/0009695 | A1 | 1/2012 | Amada et al. | |
| 2012/0068311 | A1 | 3/2012 | Yamazaki | |
| 2013/0140586 | A1* | 6/2013 | Takahashi | H01L 29/1608 257/77 |
| 2014/0130969 | A1* | 5/2014 | McCutcheon | B32B 7/06 156/247 |
| 2015/0249133 | A1* | 9/2015 | Yanase | H01L 24/83 257/77 |
| 2015/0279718 | A1* | 10/2015 | Brun | H01L 21/6838 156/707 |
| 2016/0197149 | A1 | 7/2016 | Sakai | |
| 2017/0213918 | A1 | 7/2017 | Sasaki et al. | |

FOREIGN PATENT DOCUMENTS

| | | |
|---|---|---|
| JP | 2003-282845 | 10/2003 |
| JP | 2010-529646 | 8/2010 |
| JP | 2010-251632 | 11/2010 |
| JP | 201541638 A | 3/2015 |
| JP | 201631953 A | 3/2016 |
| WO | 2010/140666 A1 | 12/2010 |

OTHER PUBLICATIONS

Japanese Office Action dated Nov. 12, 2019 from Japanese Patent Application No. 2016-056559, 6 pages.

* cited by examiner

METHOD OF MANUFACTURING SEMICONDUCTOR DEVICE BY REMOVING A BULK LAYER TO EXPOSE AN EPITAXIAL-GROWTH LAYER AND BY REMOVING PORTIONS OF A SUPPORTING-SUBSTRATE TO EXPOSE PORTIONS OF THE EPITAXIAL-GROWTH LAYER

CROSS REFERENCE TO RELATED APPLICATIONS AND INCORPORATION BY REFERENCE

This application claims benefit of priority under 35 USC 119 based on Japanese Patent Application No. 2016-056559 filed on Mar. 22, 2016, the entire contents of which are incorporated by reference herein.

BACKGROUND OF THE INVENTION

1. Field of the Invention

The present invention relates to a semiconductor device and a method of manufacturing the semiconductor device.

2. Description of the Related Art

In power semiconductors such as vertical insulated-gate Field Effect Transistors (FETs) like "metal-oxide-semiconductor (MOS) FETs", a current flows between an electrode at a top surface of a semiconductor substrate and an electrode at a bottom surface of the semiconductor substrate, and ON/OFF is controlled by a MOS structure formed in the upper surface side. For example, in the case of a vertical MOS device, when a current flows and the device turns "ON", the current passes through the electrode at the top surface, a channel region, a drift layer, and the bottom-surface electrode. Therefore, a loss according to electric resistance of each component occurs. In addition, in the case where the device includes a Junction Field Effect Transistor (JFET) region in order to establish a high breakdown voltage, as the electric resistance further increases, the loss further increases. As one of methods of reducing such a loss, a method of reducing a resistance component of a drift layer by thinning a semiconductor substrate is known.

Herein, the factor of determining the breakdown voltage are roughly an electric-field intensity applied to the device, specific resistivity of the semiconductor substrate, and a thickness of the semiconductor substrate. The electric-field intensity is controlled by being designed so that the electric-field intensity is equal to or smaller than a value of dielectric breakdown strength depending on a material of the semiconductor substrate. For example, the dielectric breakdown strength of silicon (Si) is 0.3 MV/cm, and in order to achieve a breakdown voltage of 1200 V, a thickness of about 120 micrometers is required. The specific resistivity of the semiconductor substrate is controlled by adjusting a concentration of impurities doped into the semiconductor substrate. In addition, the thickness of the semiconductor device roughly depends on the thickness of the drift layer.

Therefore, in the case where a structure for suppressing extension of a depletion layer by a field stop layer or the like is introduced, or in the case where a desired breakdown voltage is lower, the semiconductor substrate can be further thinned to reduce the resistance component of the drift layer, but a mechanical strength of the semiconductor substrate itself is reduced. As a method for solving the above problem, for making the semiconductor substrate thin under a state where the mechanical strength of the semiconductor substrate is enhanced, a scheme of grinding the bottom surface portion of the semiconductor substrate is known. The scheme of grinding is conducted under a state such that the semiconductor substrate is bonded to a plate different from the semiconductor substrate at an upper surface side of the semiconductor substrate in which the device structure is provided. Here, the plate different from the semiconductor substrate serves as a supporting-substrate.

However, in the case of wide bandgap semiconductors such as silicon carbide (SiC), gallium nitride (GaN), or diamond (C), problems different from the case of Si occurs. For example, the dielectric breakdown strength of 4H—SiC is 2.8 MV/cm, which is about ten times larger than the dielectric breakdown strength of Si. Therefore, while achieving a higher breakdown voltage corresponding to the level of the breakdown voltage of Si, a thickness required for the semiconductor substrate of SiC may be about one-tenth ($1/10$) of the thickness of Si. For example, even at a breakdown voltage of 1200 V, the required thickness is only about ten micrometers.

Therefore, SiC is advantageous because the resistance component can be made smaller than the resistance component of Si and the loss of the device can be reduced by thinning the drift layer of the semiconductor substrate. However, if the thickness becomes extremely thin as about ten micrometers, because the mechanical strength of the semiconductor substrate of SiC becomes extremely low, various problems occur under the state where the supporting-substrate on the top surface is removed, after the thinning process.

For example, a high possibility such that the semiconductor substrate might be broken due to deformation ascribable to the stress caused by dicing process, or due to stress deformation when a diced chip is joined to a dicing tape or the like exists. In addition, deformation or the like brought by a thick adhesive of the dicing tape will cause a high possibility that the semiconductor substrate might be broken after the joining process.

In addition, if the semiconductor substrate is extremely thin, the treatment of a single chip will produce a high possibility that the chip might be easily broken due to internal stress caused by a change in the device structure, or by a temperature change, or alternatively, due to external stress ascribable to the treatment of the single chip or connection with wirings, or the like.

Even in the case where a supporting-substrate is attached to the top surface of the semiconductor substrate, if the semiconductor substrate is extremely thin, there is a high possibility that the semiconductor substrate might be damaged by an impact at the time of detaching the supporting-substrate from the semiconductor substrate. As described above, there is a problem such that the handling difficulty of the chips greatly increases as the thickness of the wide bandgap semiconductor becomes extremely thin, because the mechanical strength is greatly lowered.

In view of a method for reinforcing the mechanical strength of the semiconductor device, WO 2010/140666A discloses a method using a reinforcement ring in the outer periphery of the bottom surface of a semiconductor substrate, or of the bottom surface of a wafer. In addition, JP 2010-251632A discloses a method of providing a reinforcement glass on a device-side surface of the semiconductor substrate. However, in the methods of WO 2010/140666A and JP 2010-251632A, although the mechanical strength of the semiconductor substrate before dicing can be mechanical strengthened, because the reinforcement ring or the reinforcement glass is removed in the dicing process of the chips, the mechanical strength as individual chips cannot be enhanced, and handling the chips after dicing is hard.

In addition, JP 2010-529646A discloses a method for selectively removing portions of the substrate to intentionally leave thick regions of the substrate in the chip state. However, the SiC is a material which is relatively hard to process, and in the case of the method of JP 2010-529646A, a problem exists such that much time and cost are required for the manufacturing works.

In addition, JP 2002-076326A discloses a method which use one of two Si substrates as a rib on a bottom-surface of the other Si substrate, after direct-bonding the two Si substrates. However, in JP 2002-076326A, a SiC substrate is not considered. For manufacturing a SiC device, thermal processes are performed at a high temperature of about 1600° C. or more so as to enable SiC epitaxial growth and impurity doping into SiC.

On the other hand, the melting point of Si is about 1414° C., which is lower than 1600° C. In JP 2002-076326A, since the melting point of Si is not considered, when the Si substrate is used as the rib of the SiC substrate as it is, the Si substrate cannot withstand the process temperature of the SiC epitaxial growth and the impurity doping into SiC. Therefore, a SiC device that can be used actually cannot be manufactured by JP 2002-076326A.

In addition, JP 2003-282845A discloses a method of bonding two substrates through an oxide film. However, in order to manufacture a vertical semiconductor device, removing the oxide film at a bonding surface is necessary, but detailed description associated with removing process of the oxide film is not clearly disclosed in JP 2003-282845A. In addition, although the description that the oxide film becomes an etch stopper is recited in JP 2003-282845A, a process of removing an unnecessary oxide film after stop of etching is not described.

Therefore, in the case of JP 2003-282845A, manufacturing a vertical semiconductor device is actually difficult. In addition, when the oxide film at the bonding interface is removed by etching, a problem of lowering of the bonding-strength between the two substrates occurs, because the remove of the etchant, which has been intruded into the bonding interface during etching, is very difficult.

SUMMARY OF THE INVENTION

The present invention is to provide a method of manufacturing a semiconductor device maintaining a sufficient mechanical strength with minimized manufacturing-burden when a wide bandgap semiconductor substrate is required to be thinned, and provide the semiconductor device.

An aspect of the present invention inheres in a method of manufacturing a semiconductor device including (a) assigning a plurality of chip regions on an epitaxial-growth layer of a semiconductor substrate where the epitaxial-growth layer is grown on a bulk layer and forming a plurality of device structures on the plurality of chip regions, respectively, (b) thinning the semiconductor substrate from a bottom-surface side of the bulk layer, (c) bonding a supporting-substrate on a bottom surface of the thinned semiconductor substrate, (d) selectively removing the supporting-substrate so that the bottom surface of the semiconductor substrate is exposed, at locations corresponding to positions of each of main current paths in the plurality of device structures, respectively, (e) dicing the semiconductor substrate together with the supporting-substrate along dicing lanes between the plurality of the chip regions so as to form a plurality of chips.

Another aspect of the present invention inheres in a semiconductor device encompassing (g) a semiconductor layer having a stacked structure including an epitaxial-growth layer, (h) a device structure provided on the epitaxial-growth layer, (i) a supporting leg made of a semiconductor different from that of the semiconductor layer and selectively provided on a bottom surface of the semiconductor layer so that a bottom surface corresponding to a position of a main current path of the device structure is exposed, and (j) a bottom-surface electrode as an ohmic contact provided on the exposed bottom-surface side of the semiconductor layer.

Still another aspect of the present invention inheres in a semiconductor device encompassing (k) an epitaxial-growth layer of a semiconductor, (l) a device structure provided on the epitaxial-growth layer, (m) a supporting leg selectively provided on a bottom surface of the epitaxial-growth layer so that a bottom surface corresponding to a position of a main current path of the device structure is exposed, and (n) a bottom-surface electrode as an ohmic contact provided on the exposed bottom-surface side of the epitaxial-growth layer.

Therefore, the semiconductor device maintaining a sufficient mechanical strength can be manufactured with the minimized manufacturing-burden, when the wide bandgap semiconductor substrate is required to be thinned, by the method of manufacturing the semiconductor device according to the present invention. In addition, the semiconductor device according to embodiments of the present invention can have a sufficient mechanical strength in a chip state.

DETAILED DESCRIPTION OF THE EMBODIMENTS

Figure 1A:
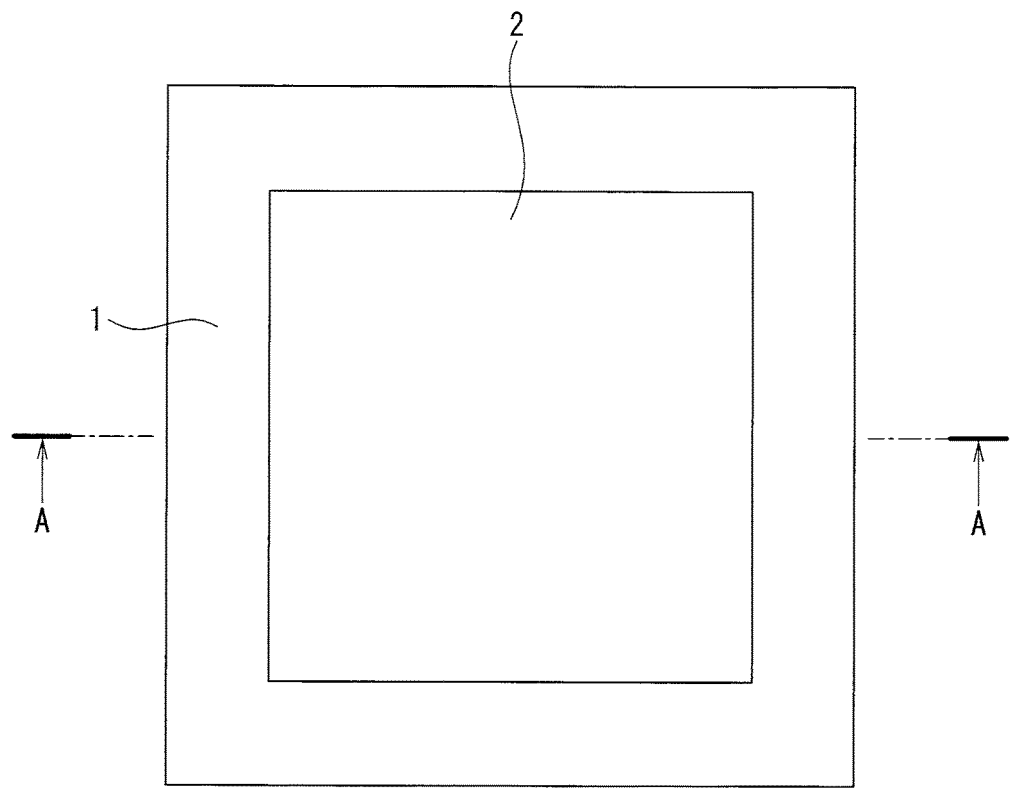
FIG. 1A is a schematic top view illustrating a configuration of a semiconductor device according to a first embodiment.

Hereinafter, first to sixth embodiments of the present invention will be described. In the following description of the drawings, the same or similar components are denoted by the same or similar reference numerals. However, it should be noted that the drawings are schematic, relationships between thickness and planar dimensions, ratios of thickness among devices and members, and the like are different from the actual ones. Therefore, specific thicknesses and dimensions should be determined with reference to the following description. In addition, the drawings may also include components having different dimensional relationships and ratios among the figures.

In addition, in the following description, directions of "left-right" and "up-down" are defined merely for convenience of description but, these do not limit the technical idea of the present invention. Therefore, for example, if the paper is rotated by 90 degrees, "left" and "up" are exchanged and read, and if the paper is rotated by 180 degrees, "left" becomes "right" and "right" becomes "left". In the specification and the attached drawings of the present invention, electrons or holes are majority carriers in regions or layers superscripted with n or p, respectively.

In addition, + or − attached to n or p denotes that the semiconductor region is relatively high or low in impurity concentration in comparison with the semiconductor region to which + and − are not attached. However, even with n+ and a notation indicating the same concentration as n+, these do not limit the fact that the impurity concentrations are actually the same.

First Embodiment (Semiconductor Device)

Figure 1B:
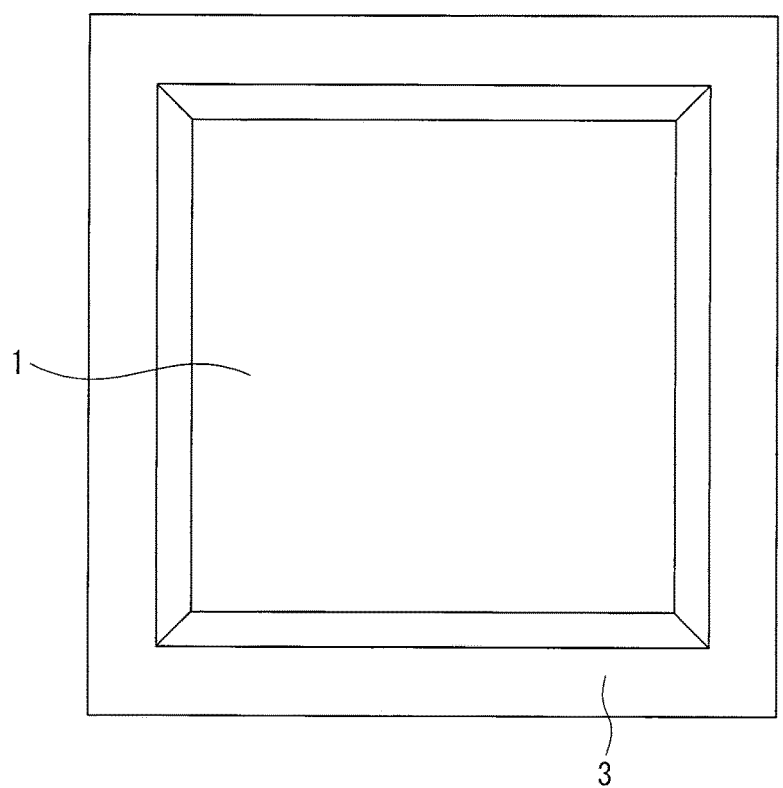
FIG. 1B is a schematic bottom view illustrating the configuration of the semiconductor device according to the first embodiment.

As illustrated in FIG. 1A, a semiconductor device according to a first embodiment includes an epitaxial-growth layer 1 mainly made of SiC and a device structure 2 provided on the epitaxial-growth layer 1. In addition, as illustrated in FIG. 1B, the semiconductor device according to the first embodiment includes a supporting leg 3 selectively provided on a peripheral portion of a bottom surface of the epitaxial-growth layer 1, or a rear surface of the epitaxial-growth layer 1 so that a central portion of the bottom surface of the epitaxial-growth layer 1 is partially exposed.

Figure 2:
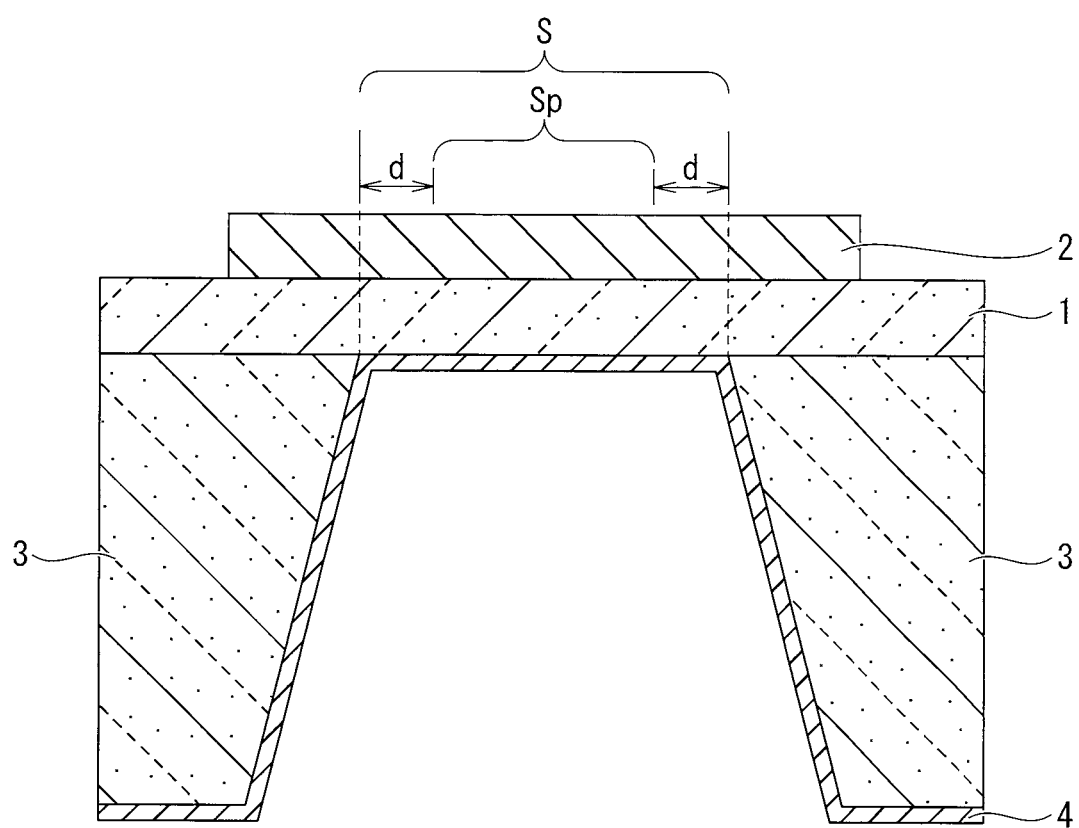
FIG. 2 is a schematic cross-sectional diagram as viewed in a direction of line A-A of FIG. 1A.

As illustrated in FIG. 2, a bottom-surface electrode 4 is provided on the exposed bottom surface of the epitaxial-growth layer 1 and a bottom surface of the supporting leg 3. The bottom-surface electrode 4 is a conductive film made of, for example, nickel (Ni), aluminum (Al), NiAl, or the like.

The supporting leg 3 is mainly made of Si, and as illustrated in FIG. 2, a top surface of the supporting leg 3 is located at 'a groin' defined on the bottom surface of the epitaxial-growth layer 1. As illustrated in FIG. 1B, the planar pattern of the supporting leg 3 as viewed from the bottom-surface side is a frame-like shape having a substantially square outer edge. The width of the supporting leg 3 along the left to right direction illustrated in the cross-sectional diagram of FIG. 2 becomes narrower and narrower in the direction from the upper side toward the lower side in FIG. 2. Therefore, the side surface of the inner edge side of the supporting leg 3 located between the bottom surface of the supporting leg 3 and the bottom surface of the epitaxial-growth layer 1 implements an inclined surface slanted at an inclination-angle tilted with respect to the vertical direction.

Namely, the supporting leg 3 encloses a recessed portion where the exposed bottom surface of the epitaxial-growth layer 1 is the bottom surface of the recessed portion and the inclined surface of the supporting leg 3 being continuous with the bottom surface becomes the side wall surface of the recessed portion. The cross-sectional topology of the recessed portion illustrated in FIG. 2 is an isosceles trapezoid shape.

The position and shape of the bottom surface of the recessed portion can be appropriately designed. However, in order to achieve the designed device characteristics, a preferred topology is such that the planar pattern which is substantially coincident with the planar pattern of the active area which is scheduled to be the main current path of the device, or alternatively, the area of the active area shall be located in the inside of a planar pattern defined by the inner contour of the top-surface area of the supporting leg 3. If the topology is such that the area of the active area becomes wider than the planar pattern defined by the inner contour of the top-surface area of the supporting leg 3 and overlaps with the supporting leg 3, in an area where the current is supposed originally to flow vertically toward the bottom surface of the epitaxial-growth layer 1, because an area through which the main current does not flow is generated, the ON-state voltage of the semiconductor device is increased.

In the case of the semiconductor device according to the first embodiment, as illustrated in FIG. 2, the active area is arranged in the inside of a region Sp, which has an outer edge at a position separated by a certain distance d inwards from an inner edge of the area occupied by the bottom surface of the recessed portion. As the value of the distance d, a value approximately equal to the thickness of the epitaxial-growth layer 1 may be effectively employed.

Explicit illustration of the device structure as an actual semiconductor device is omitted, since FIG. 1 and FIG. 2 represent mere schematic illustration. As the device structure, various structures of semiconductor regions such as channel regions or source regions are provided in the upper portion of the epitaxial-growth layer 1, and gate electrodes are stacked on the semiconductor regions through insulating films may be employed. The semiconductor regions in the upper portion of the epitaxial-growth layer 1 and the structure laminated on the epitaxial-growth layer 1 are merged so as to implement a device structure for the operation of current conduction.

By the semiconductor device pertaining to the first embodiment, even in the device structure 2 where the thickness of a drift layer is minimized so as to shorten the transport distance of electrons, a SiC semiconductor device having a sufficient mechanical strength may be achieved. In addition, in the semiconductor device according to the first embodiment, an active area is provided in the inside of the supporting leg 3 of the bottom-surface side, and a peripheral breakdown-voltage improving-structure is provided around the active area. Therefore, preventing the influence of the supporting leg 3 on the operation of current conduction in the active area is possible, and furthermore, obtaining a high-quality semiconductor device of which breakdown voltage is increased by the peripheral breakdown-voltage improving-structure, is possible.

(Method of Manufacturing Semiconductor Device)

Figure 3A:
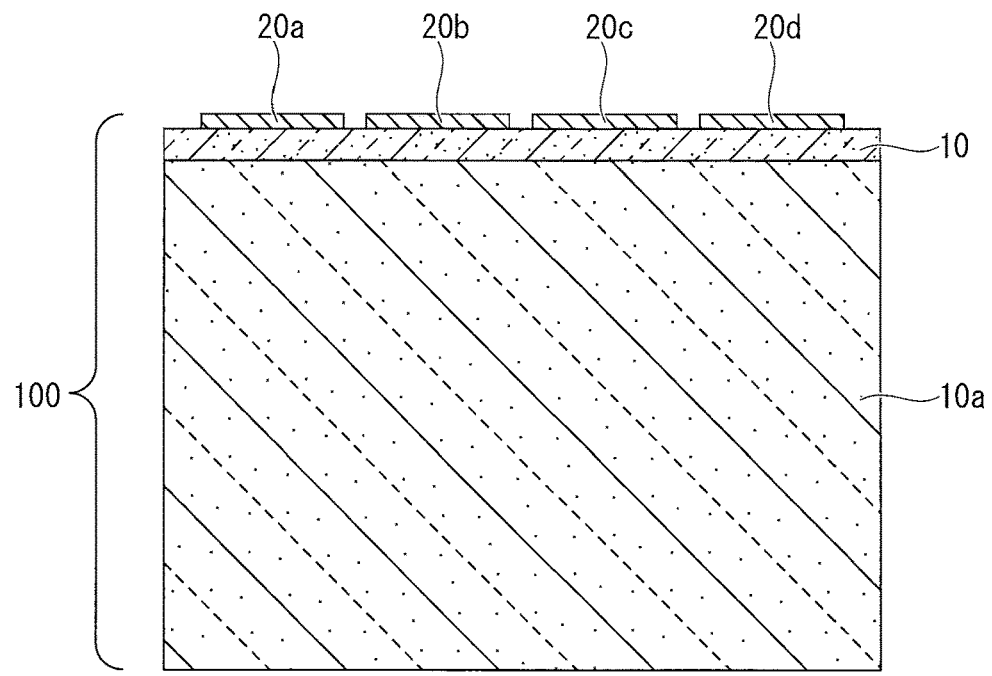
FIG. 3A is a process cross-sectional diagram illustrating a method of manufacturing the semiconductor device according to the first embodiment (No. 1)

Next, a method of manufacturing the semiconductor device according to the first embodiment will be described. First, as illustrated in FIG. 3A, a semiconductor substrate, or semiconductor device wafer, implementing a bulk layer 10a made of 4H—SiC with an impurity concentration of about $1\times10^{18}$ cm$^{-3}$ and a thickness of about 350 micrometers is prepared. Next, an epitaxial-growth layer 10 of SiC having a thickness of about ten micrometers is epitaxially grown on the bulk layer 10a.

Next, after predetermined impurity-ions are implanted into each of chip regions assigned in a two-dimensional matrix shape on the epitaxial-growth layer 10, an activation process is performed to implement semiconductor regions required for the respective chip regions. For example, if the semiconductor device is an MOSFET, at the same time when channel regions and source regions are formed, other regions such as base contact regions, JFET regions, and the like are appropriately formed in the respective chip regions.

Next, a predetermined insulating film such as a gate insulating film or an interlayer insulating film is laminated on the epitaxial-growth layer 10, and contact holes are opened in the insulating film by a photolithography technique and an etching technique. A SiC semiconductor substrate, or SiC wafer, 100 is established, in which a plurality of device structures 20a to 20d where conductive plugs or the like implementing contact electrodes and the like buried in the open contact holes are allocated to each of the chip regions arranged in a two-dimensional matrix shape.

Figure 10A:
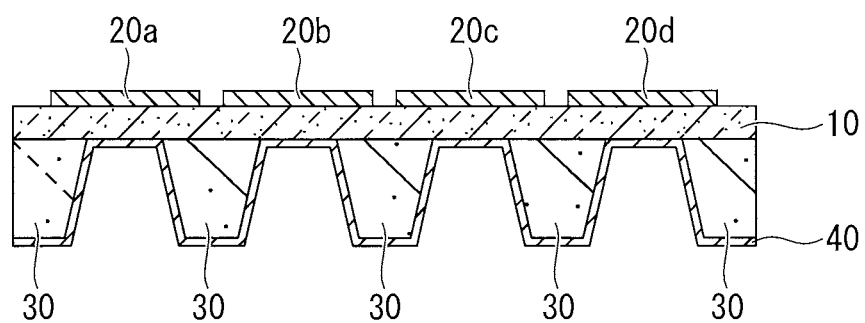
FIG. 10A is a process cross-sectional diagram illustrating the method of manufacturing the semiconductor device according to the first embodiment (No. 11)

As materials used in the creation of the device structures 20a to 20d, various materials having a melting point higher than the highest temperature that can be reached in the procedure of various steps performed until formation of the ohmic contact layer, which will be described later with reference to FIG. 10A, are selected so as to withstand the highest temperature.

Figure 3B:
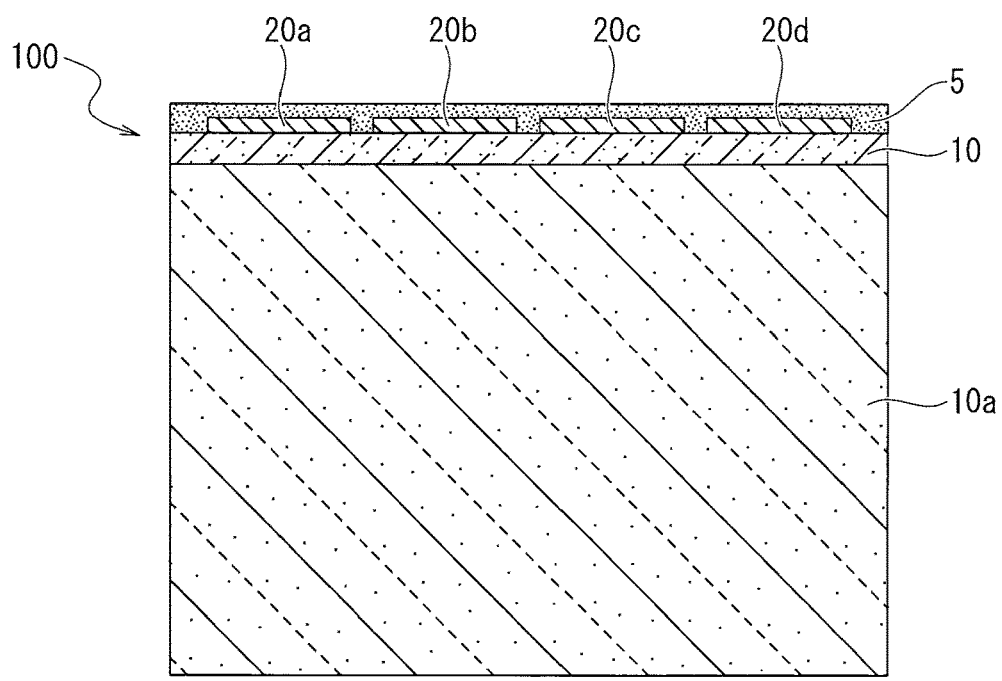
FIG. 3B is a process cross-sectional diagram illustrating the method of manufacturing the semiconductor device according to the first embodiment (No. 2)
Figure 4:
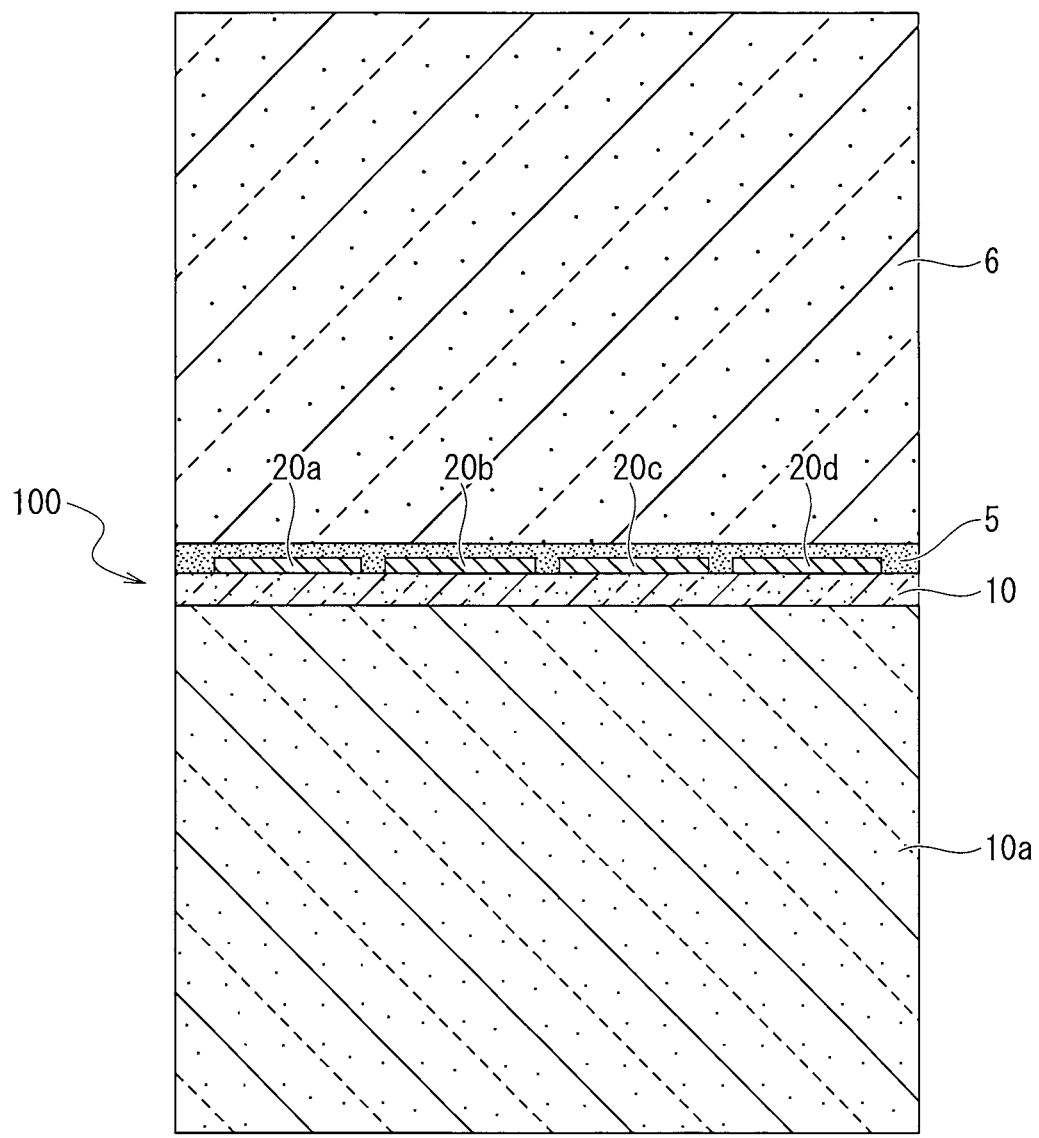
FIG. 4 is a process cross-sectional diagram illustrating the method of manufacturing the semiconductor device according to the first embodiment (No. 3)

Next, as illustrated in FIG. 3B, an adhesive layer 5 having a thickness of about ten micrometers is coated by applying an adhesive on the top surface of the SiC wafer 100 in the device structures 20a to 20d side. Next, as illustrated in FIG. 4, a top-surface supporting-substrate 6 having a thickness of about one millimeter is bonded on the top surface of the SiC wafer 100 through the adhesive layer 5.

The top-surface supporting-substrate 6 is, for example, an Si substrate, a glass substrate made of Si, or the like, and the outer diameter of the top-surface supporting-substrate 6 may be substantially the same as that of the SiC wafer 100. In addition, the top-surface supporting-substrate 6 preferably has a mechanical strength necessary for a process of SiC processing, and the Si substrate is advantages because the substrate is inexpensive.

Figure 5:
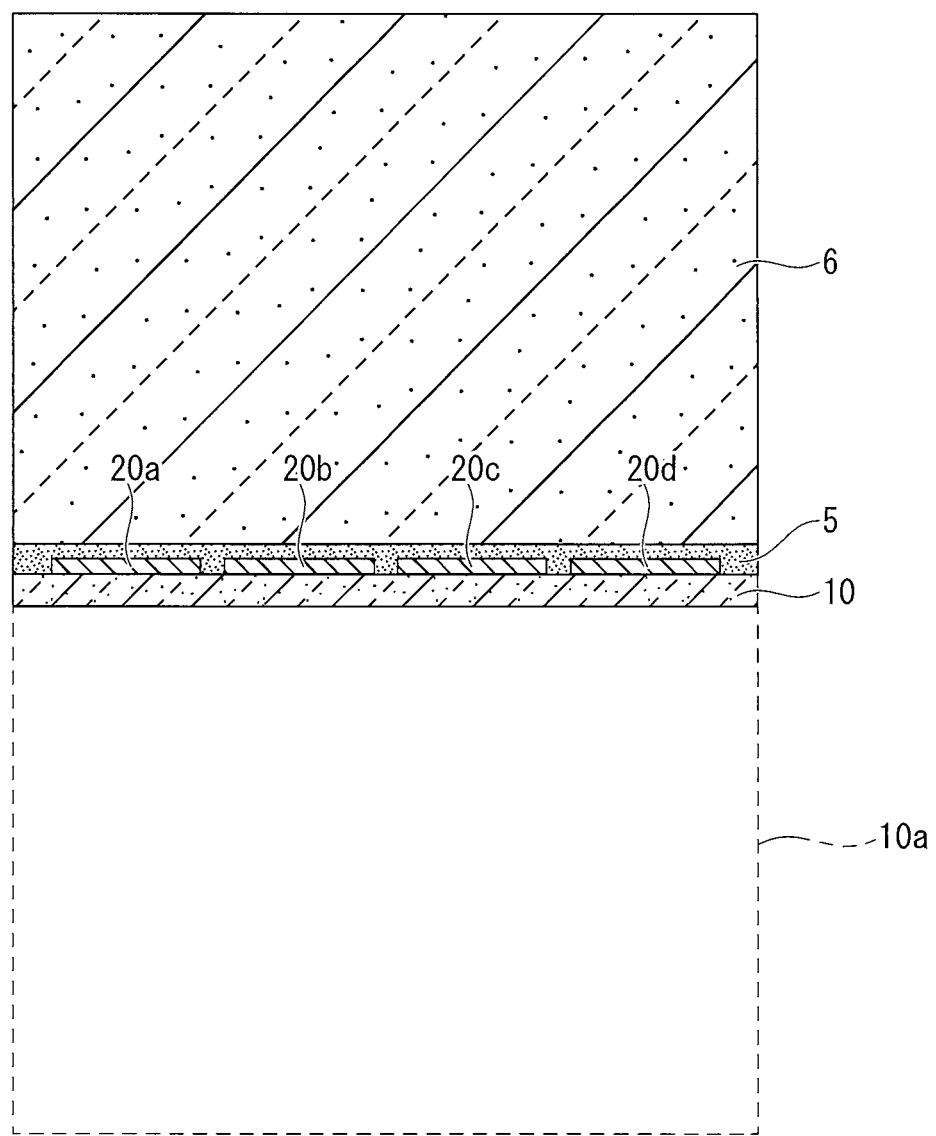
FIG. 5 is a process cross-sectional diagram illustrating the method of manufacturing the semiconductor device according to the first embodiment (No. 4)

Next, as illustrated in FIG. 5, the bulk layer 10a is removed by grinding on the bottom surface of the SiC wafer 100, and the thickness of the device wafer is adjusted to be about ten micrometers, so that the bottom surface of the epitaxial-growth layer 10 is exposed. Next, the finish state is controlled by polishing the grinded bottom surface of the epitaxial-growth layer 10 so that an arithmetic average surface roughness Ra of the polished surface is set to a distance of about a fluctuation distance of a crystal lattice, which is close to the lattice spacing of a SiC crystal. The arithmetic average surface roughness Ra is defined in the appendixes of Japanese Industrial Standards (JIS)B 0031 and JISB 0061. Specifically, for example, mirror finish shall be achieved so that the arithmetic average surface roughness Ra of the polished surface of the bottom surface of the epitaxial-growth layer 10 is about ≤0.5 nanometer.

Figure 6:
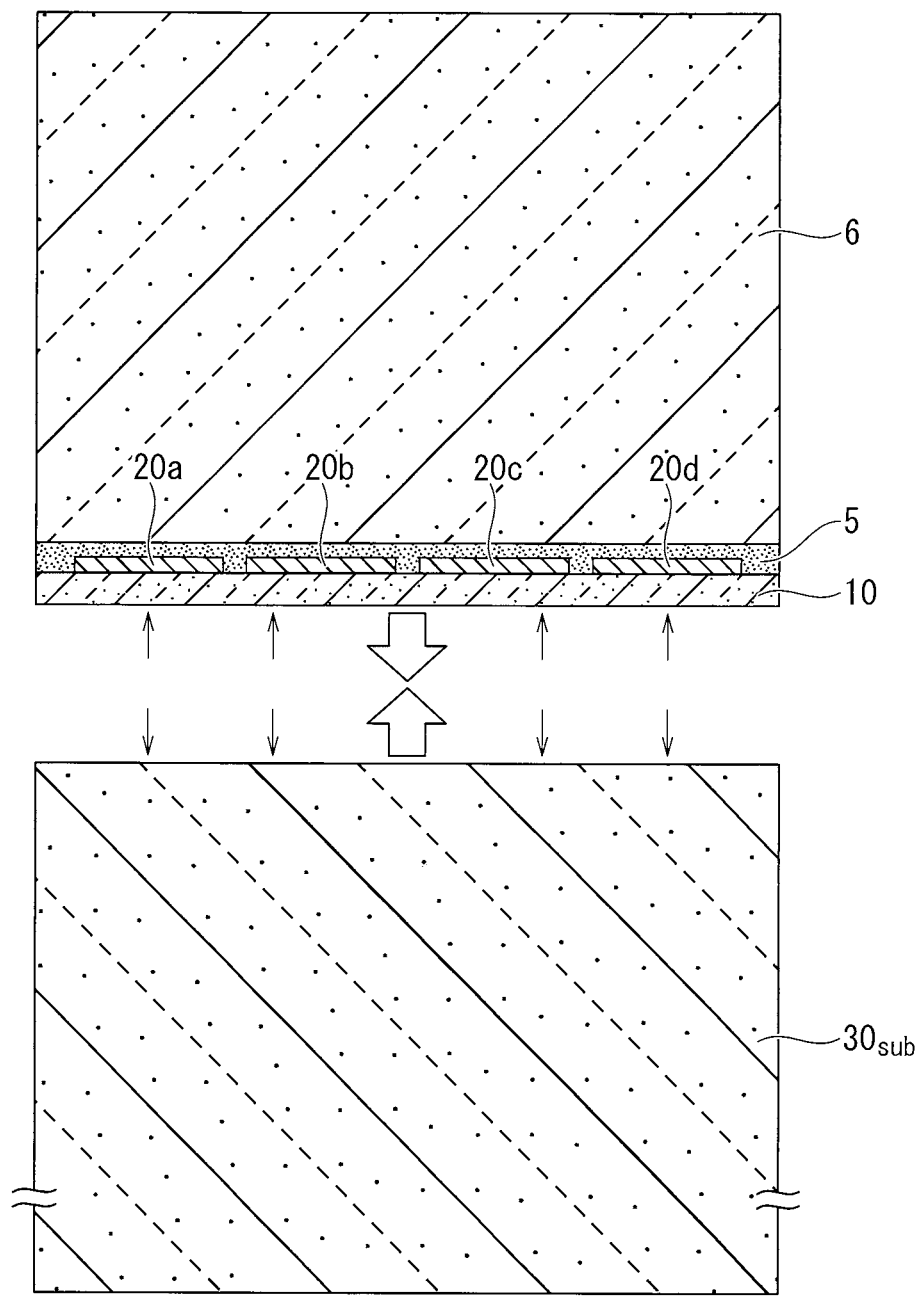
FIG. 6 is a process cross-sectional diagram illustrating the method of manufacturing the semiconductor device according to the first embodiment (No. 5)

Next, as illustrated in FIG. 6, an Si substrate where at least one-side surface is finished to be a mirror surface having an arithmetic average surface roughness Ra of about ≤0.5 nanometer by a polishing process is prepared as a bottom-surface supporting-substrate 30$_{sub}$ corresponding to a "supporting-substrate" of the present invention. A material of the bottom-surface supporting-substrate 30$_{sub}$ is different from the semiconductor material of the semiconductor substrate which is SiC. Next, the polished mirror surface of the bottom surface of the SiC wafer 100 and the mirror surface of the bottom-surface supporting-substrate 30$_{sub}$ made of Si are bonded to each other as illustrated by open wide arrows (white arrows) in FIG. 6.

In the bonding, a surface activation method at room temperature is preferred, such that mating the two activated surfaces at room temperature so as to be in contact with each other. Specifically, for example, a plasma activation process of irradiating a surface with oxygen plasma, a gas activation process using fluorine (F) gas, nitrogen (N) gas, or the like, a beam activation process of irradiating with beams of inert elements of argon (Ar) or the like for activation, or the like may be appropriately selected as a surface activation method. In FIG. 6, the activation process for the bottom surface of the SiC wafer 100 and the top surface of the bottom-surface supporting-substrate $30_{sub}$ is illustrated by solid arrows.

The bonding shall be conducted in vacuum so that surfaces can be directly bonded under no oxide-film existing condition, or may be performed through intermediate layers laminated on both or one of the SiC wafer 100 and the bottom-surface supporting-substrate $30_{sub}$. As an intermediate layer, an extremely thin film, for example, an insulating film or a Si layer having a thickness of several nanometers to about ten nanometers may be employed. The intermediate layer may be an extremely thin film of the order of several nanometers such as a film having a thickness of about one-molecular layer or a monoatomic film. In the case of the bonding of SiC with Si, the thickness of the intermediate layer is selected to be at the level of, for example, one molecule to five molecules thick layer.

In the case of using the plasma activation process using oxygen plasma as a surface activation method, a layer containing hydroxyl groups (OH groups) and water molecules ($H_2O$) at molecular layer level adsorbed on the bonding surface by the oxygen plasma becomes the intermediate layer for the bonding. By annealing process after taking out the SiC water 100 into the atmosphere, the intermediate layer made of water molecules ascribable to the plasma process can be removed.

Figure 7:
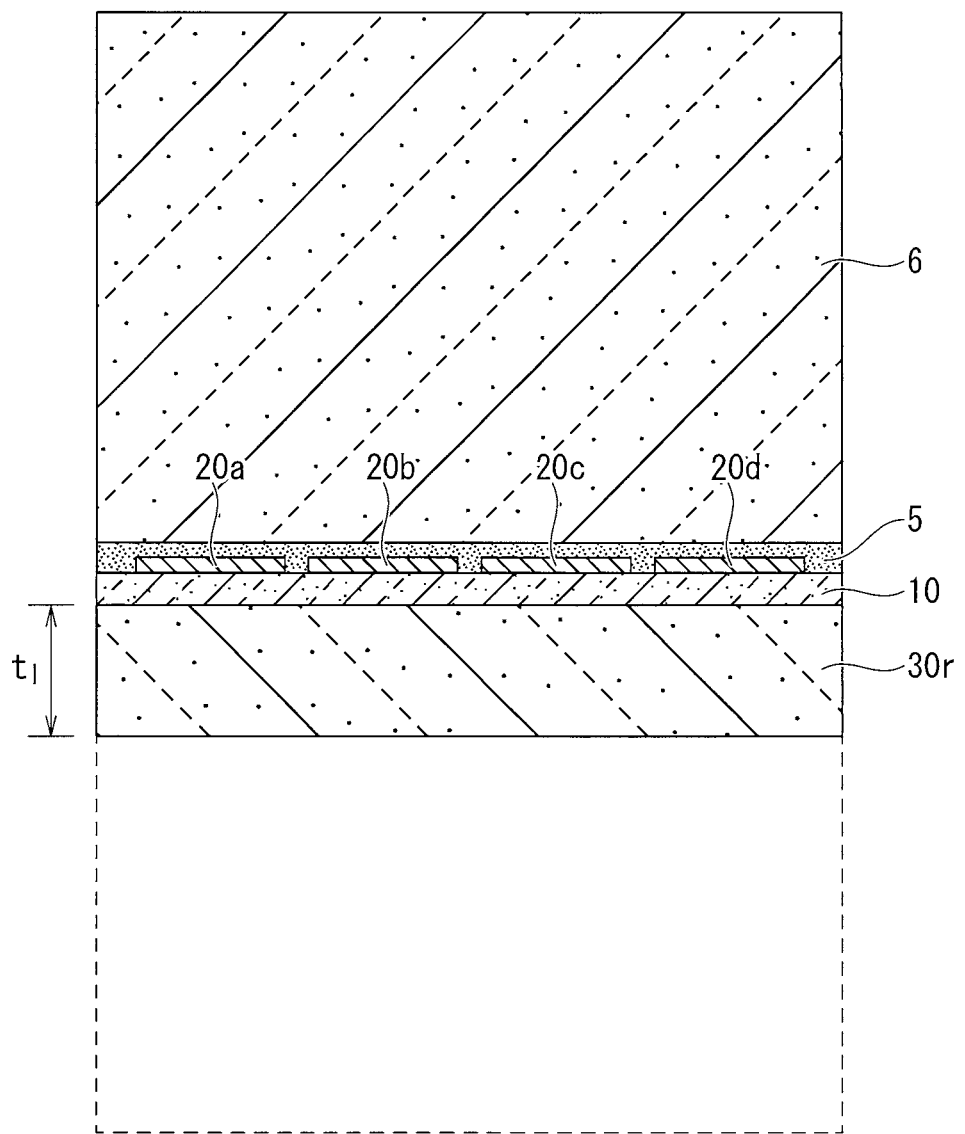
FIG. 7 is a process cross-sectional diagram illustrating the method of manufacturing the semiconductor device according to the first embodiment (No. 6)

Next, as illustrated in FIG. 7, by grinding the bottom-surface supporting-substrate $30_{sub}$ made of Si, which is bonded to the SiC wafer 100, the bottom-surface supporting-substrate $30_{sub}$ is thinned to a thickness $t_1$ of about 80 micrometers. In FIG. 7, the bottom-surface supporting-substrate 30r, which is thinned to have a thickness $t_1$, is illustrated.

Figure 8A:
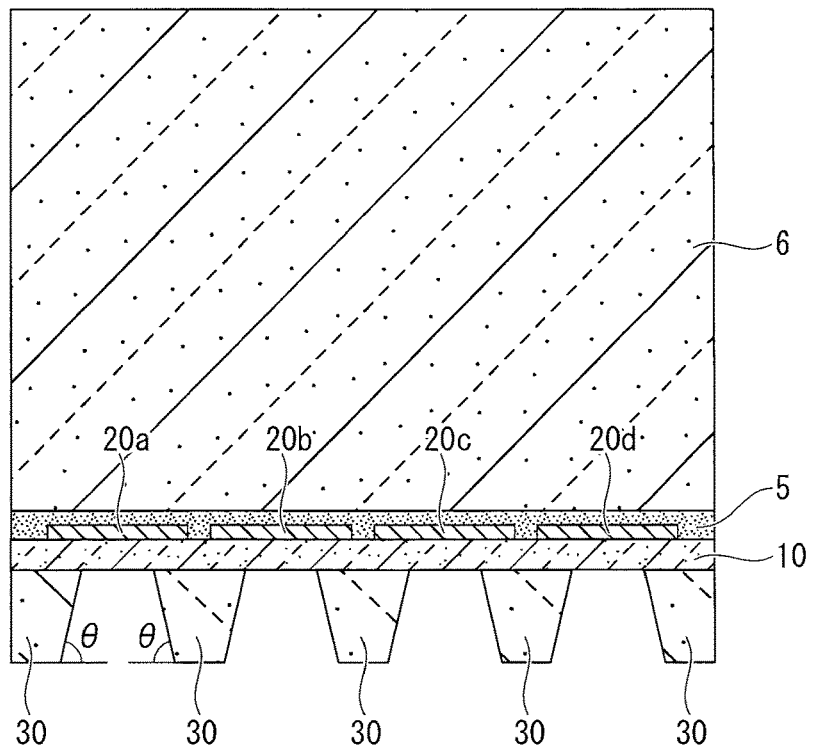
FIG. 8A is a process cross-sectional diagram illustrating the method of manufacturing the semiconductor device according to the first embodiment (No. 7)

Next, the bottom-surface supporting-substrate 30r made of Si is delineated by selective etching through photolithography technique, anisotropic etching, and the like, so that the positions of the delineated patterns are aligned with the patterns of the device structures 20a to 20d. Then, as illustrated in FIG. 8A, support structures 30 with patterns of recessed portions, each of recessed portions correspond to an opening portion where the epitaxial-growth layer 10 is exposed, are formed at the bottom surface of the epitaxial-growth layer 10, the positions of the recessed portions corresponds to the plurality of device structures 20a to 20d.

Figure 8B:
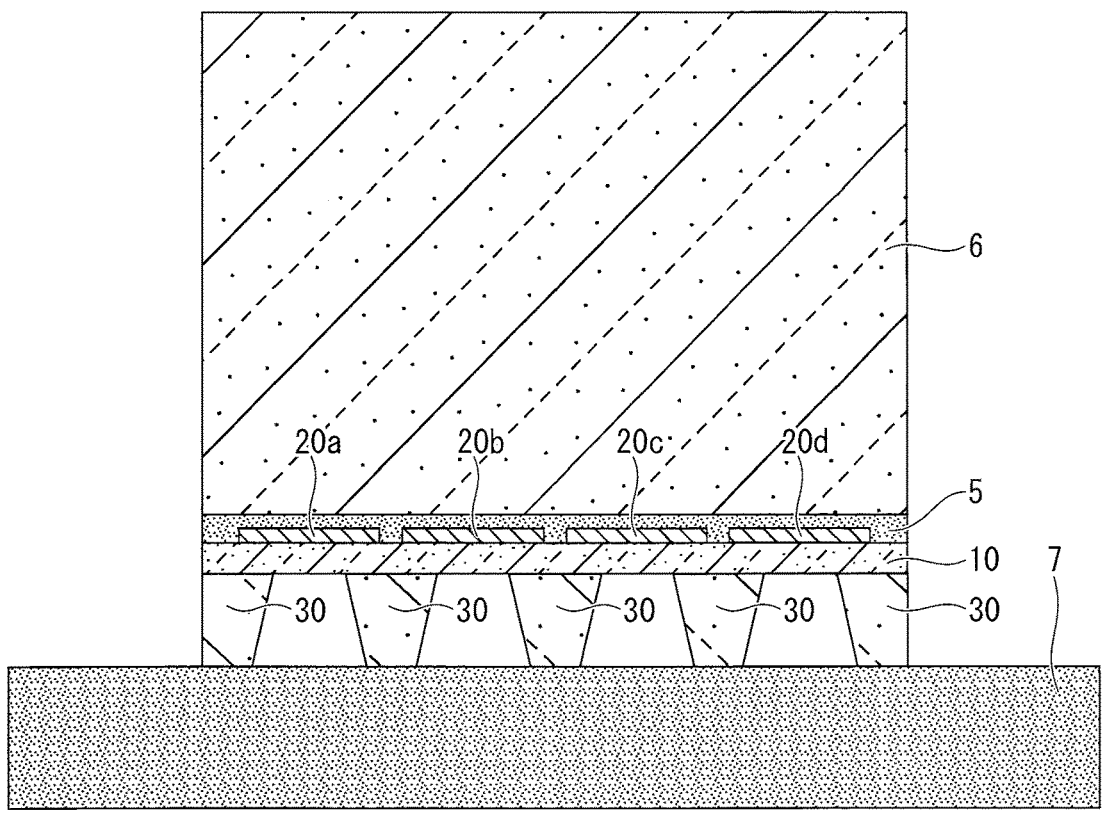
FIG. 8B is a process cross-sectional diagram illustrating the method of manufacturing the semiconductor device according to the first embodiment (No. 8)

Namely, the anisotropic etching is executed to control the location of each of the patterns of the bottom-surface supporting-substrate 30r made of Si is aligned to the active areas of the device structures 20a to 20d so that the bottom surface of the epitaxial-growth layer 10 is exposed. As an anisotropic etchant, for example, tetramethylammonium hydroxide (TMAH), potassium hydroxide (KOH) solution, ethylenediamine pyrocatechol (EDP), or the like may be used. If the bottom surface of the bottom-surface supporting-substrate 30r is [100] plane, the inclination angle θ of the inclined surface of the recessed portion in FIG. 8A may be approximately 52 degrees. Next, as illustrated in FIG. 8B, the bottom surface of the bottom-surface supporting-substrate 30r is adhered to a support body 7 such as an adhesive tape, and the bottom-surface supporting-substrate 30r is fixed to the support body 7.

Figure 9A:
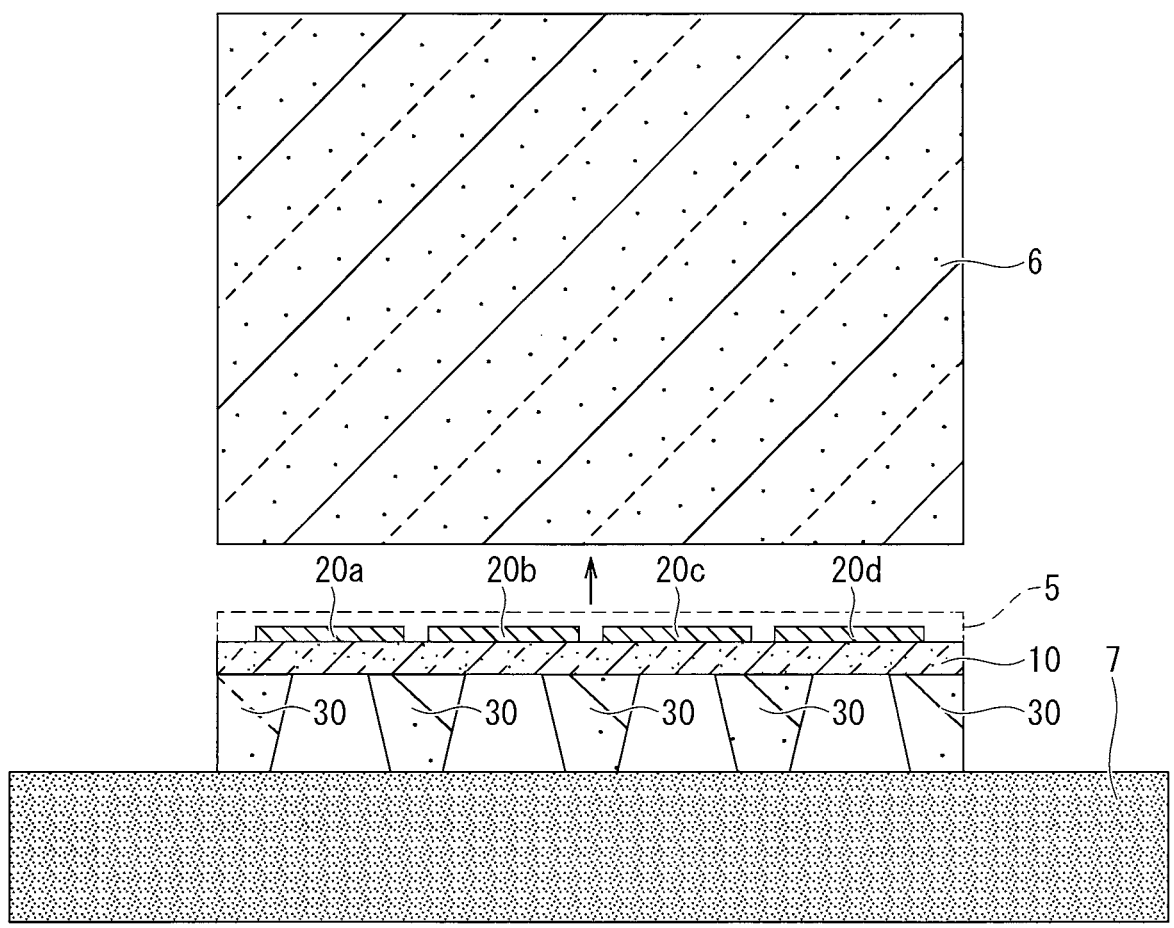
FIG. 9A is a process cross-sectional diagram illustrating the method of manufacturing the semiconductor device according to the first embodiment (No. 9)
Figure 9B:
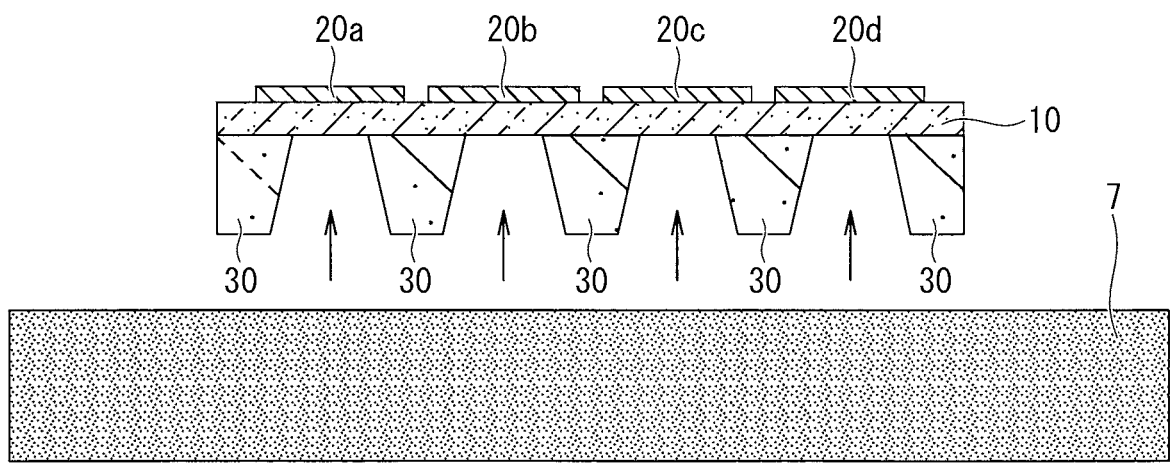
FIG. 9B is a process cross-sectional diagram illustrating the method of manufacturing the semiconductor device according to the first embodiment (No. 10)

Next, as illustrated in FIG. 9A, the adhesive force of the adhesive layer 5 is neutralized by heating or ultraviolet irradiation, etc., and the top-surface supporting-substrate 6 is peeled off from the SiC wafer 100 fixed to the support body 7. Next, as illustrated in FIG. 9B, the SiC wafer 100 is peeled off from the support body 7. If the peeling is also performed by the neutralization of the adhesive force to the support body 7 by heating or ultraviolet irradiation, etc., the SiC wafer 100 can be peeled off from the support body 7 with a relatively small force.

Next, as illustrated in FIG. 10A, for example, an Ni thin film is deposited over the entire bottom surface of the SiC wafer 100 by sputtering, vacuum vapor deposition, or the like so as to form an ohmic contact layer, and the ohmic contact layer is further annealed in a high-temperature furnace or the like so as to form a bottom-surface electrode 40. The annealing process is executed in a temperature range of equal to or more than about 500° C. and less than the melting point of Si, which is about 1414° C. Ohmic contact can be obtained by silicidation reaction according to the annealing process. The annealing process can be performed by "contact annealing" at the highest reachable temperature, which is suppressed to be about 1000° C., by using lamp annealing or the like. For the contact annealing, local-position annealing with a laser, a flash lamp, or the like may also be used.

Next, a metallic film such as titanium (Ti), Ni, Al, molybdenum (Mo), chromium (Cr) or an alloy containing these elements is stacked on the entire surfaces of the device structures 20a to 20d on the top surface of the SiC wafer 100 by sputtering, vacuum vapor deposition, or the like. And, by a photolithography technique or etching, bonding pad and patterns of further upper-electrode layers are connected to the bottom-surface electrode 40 on the lower side, although the illustration of the bonding pad and the patterns of further upper-electrode layers are omitted. If necessary, a metallic film of Ti, Ni, Al, Mo, Cr, or an alloy containing these elements is stacked on the bottom-surface electrode 40 in the inside of the recessed portions of the support structures 30 by sputtering or the like to reinforce the bottom-surface electrode 40.

Figure 10B:
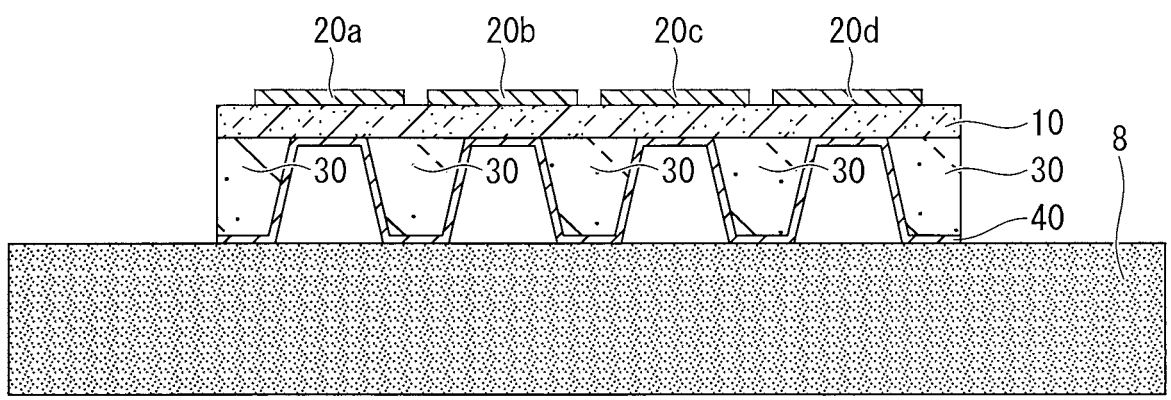
FIG. 10B is a process cross-sectional diagram illustrating the method of manufacturing the semiconductor device according to the first embodiment (No. 12)
Figure 11A:
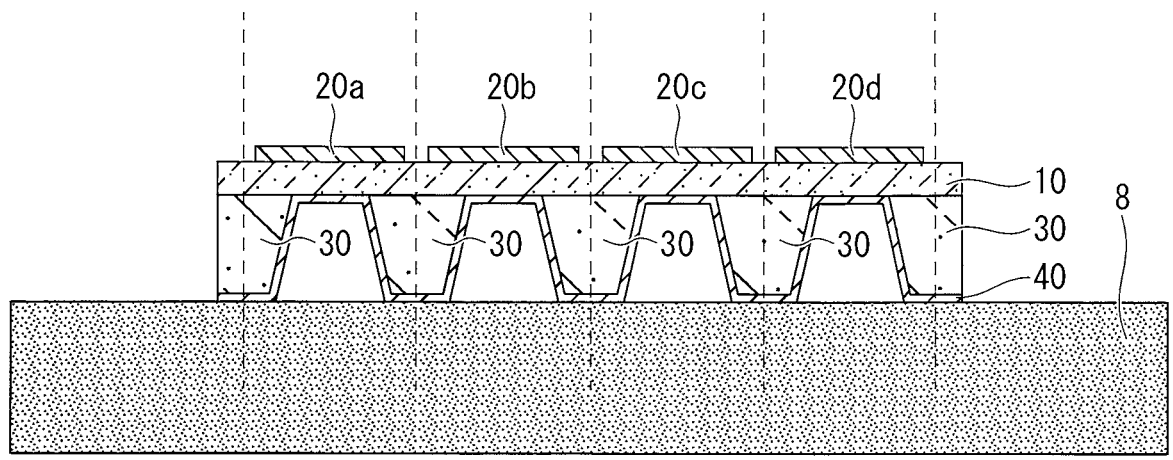
FIG. 11A is a process cross-sectional diagram illustrating the method of manufacturing the semiconductor device according to the first embodiment (No. 13)
Figure 11B:
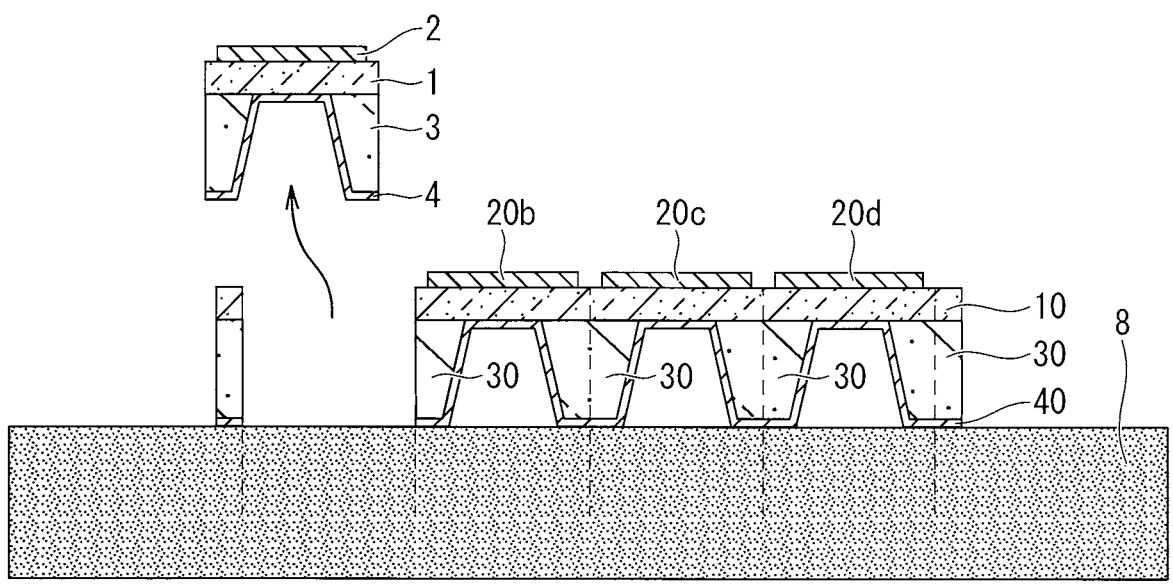
FIG. 11B is a process cross-sectional diagram illustrating the method of manufacturing the semiconductor device according to the first embodiment (No. 14)

Next, as illustrated in FIG. 10B, the SiC wafer 100 is adhered to a dicing tape 8, at the bottom-surface side of the SiC wafer 100. Next, as illustrated in FIG. 11A, dicing is executed on the SiC wafer 100 along the dicing lanes provided between chip regions. Next, as illustrated in FIG. 11B, chips (1, 2, 3, 4) obtained by dicing are individually peeled off from the dicing tape 8.

Figure 12:
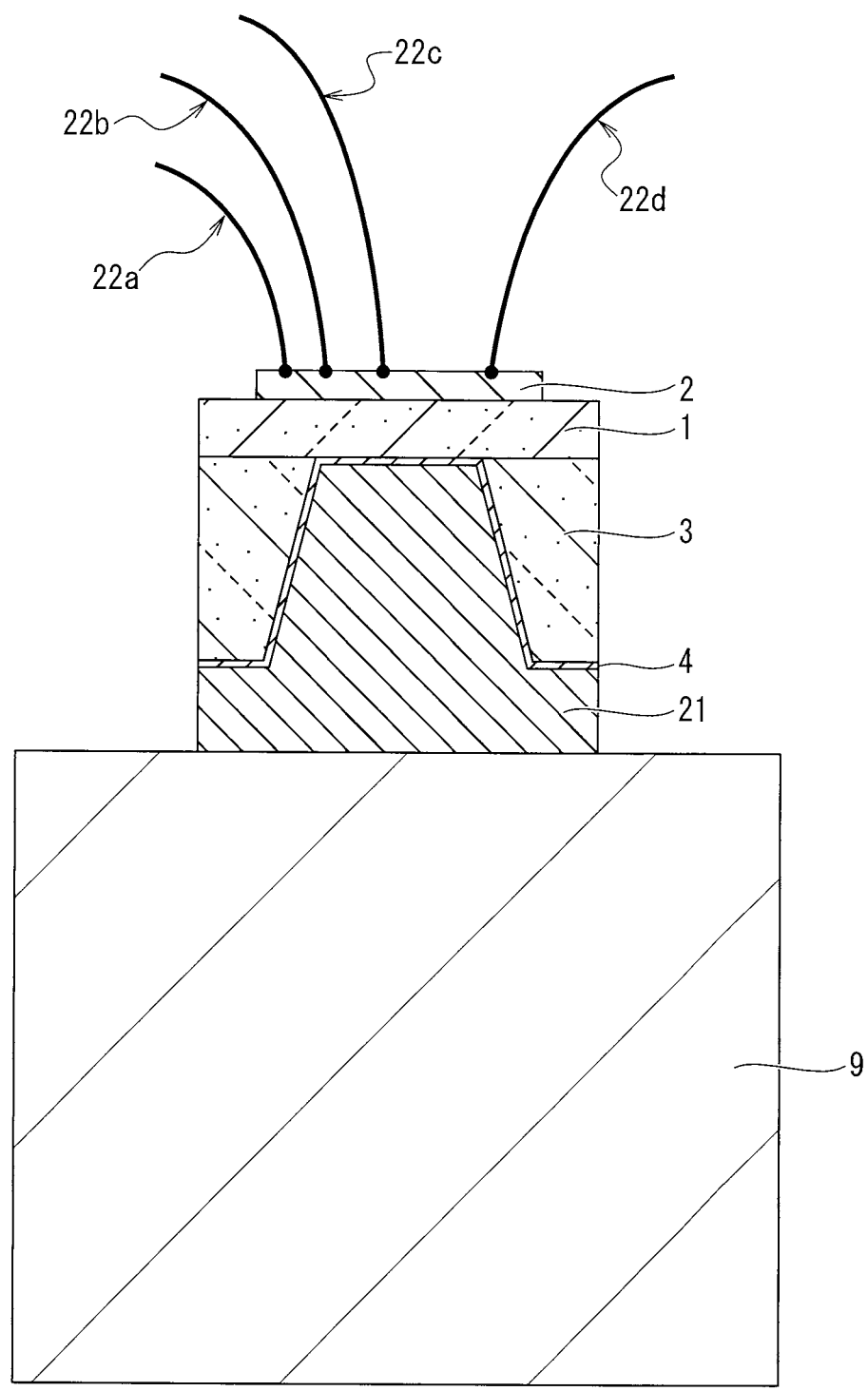
FIG. 12 is a process cross-sectional diagram illustrating the method of manufacturing the semiconductor device according to the first embodiment (No. 15)

Next, as illustrated in FIG. 12, the bottom surface of the chip (1, 2, 3, 4) is joined to a base member 9 such as a module or a lead frame by using a solder 21 or the like. Furthermore, wirings 22a to 22d are connected to a bonding electrode layer on the top surface of the chip (1, 2, 3, 4) by wire bonding, and a process such as sealing to manufacture a package, and complete the manufacturing process of the semiconductor device.

Comparative Example

Figure 13:
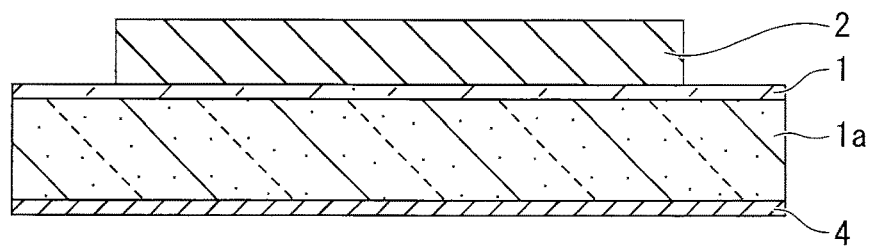
FIG. 13 is a schematic cross-sectional diagram illustrating a configuration of a semiconductor device according to Comparative Example.

As illustrated in FIG. 13, a semiconductor device according to Comparative Example includes a bulk layer 10a mainly made of SiC, an epitaxial-growth layer 1 provided on a top surface of the bulk layer 10a, and a device structure 2 provided on the epitaxial-growth layer 1. A bottom-surface electrode 4 is provided on the bottom surface of the bulk layer 1a.

The semiconductor device according to Comparative Example is different from the semiconductor device according to the first embodiment in that the supporting leg 3 illustrated in FIG. 2 is not provided, but bulk layer 1a much thicker than the epitaxial-growth layer 1 is provided to secure the mechanical strength of the semiconductor substrate. For example, the thickness of the epitaxial-growth layer 1 is about ten micrometers, and the thickness of the bulk layer 1*a* is about 70 micrometers. Since other structures of the semiconductor device according to Comparative Example are equivalent to the respective structures of the semiconductor device illustrated in FIGS. 1A, 1B and 2, the redundant description of the structures is omitted.

As a method of manufacturing the semiconductor device according to Comparative Example, first, similarly to the case illustrated in FIG. 3, an epitaxial-growth layer 10 is grown on a bulk layer 10*a*, and further, device structures 20*a* to 20*d* are formed on the epitaxial-growth layer 10 so as to provide a SiC wafer 100. Next, similarly to the case illustrated in FIG. 4, an adhesive layer 5 is coated on a top surface of the SiC wafer 100, and a top-surface supporting-substrate 6 is adhered to the adhesive layer 5.

Figure 14:
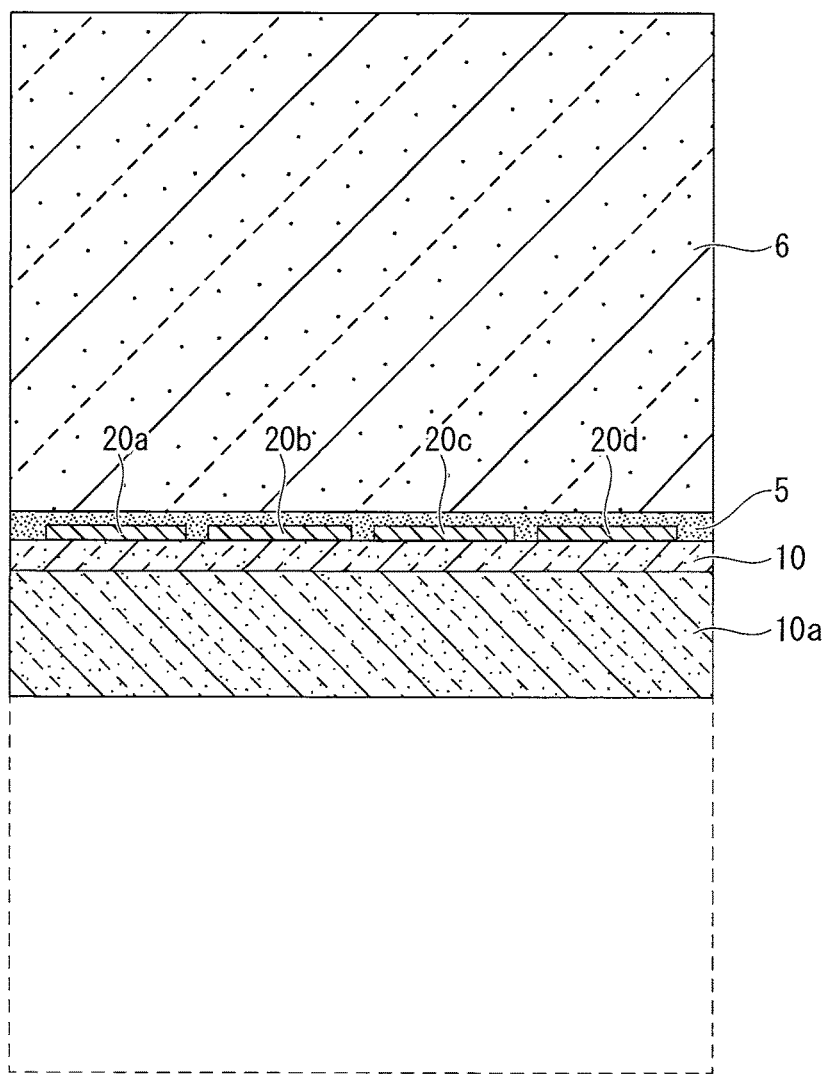
FIG. 14 is a process cross-sectional diagram illustrating a method of manufacturing a semiconductor device according to Comparative Example (No. 1)

Next, as illustrated in FIG. 14, the bulk layer 10*a* is thinned by grinding the bulk layer from the bottom surface of the bulk layer 10*a*. At the time of thinning, since the bottom-surface supporting-substrate $30_{sub}$ illustrated in FIG. 6 is not used, leaving the bulk layer 10*a* having a predetermined thickness is necessary. According to the area of the SiC wafer 100 and the details of the process, leaving the bulk layer 10*a* is necessary so that the total thickness of the epitaxial-growth layer 10 and the bulk layer 10*a* is preferably 50 micrometers or more, more preferably 70 micrometers or more. If the total thickness is smaller than 50 micrometers, the mechanical strength of the SiC wafer 100 is insufficient, and therefore, defects such as cracking or chipping occur.

Figure 15:
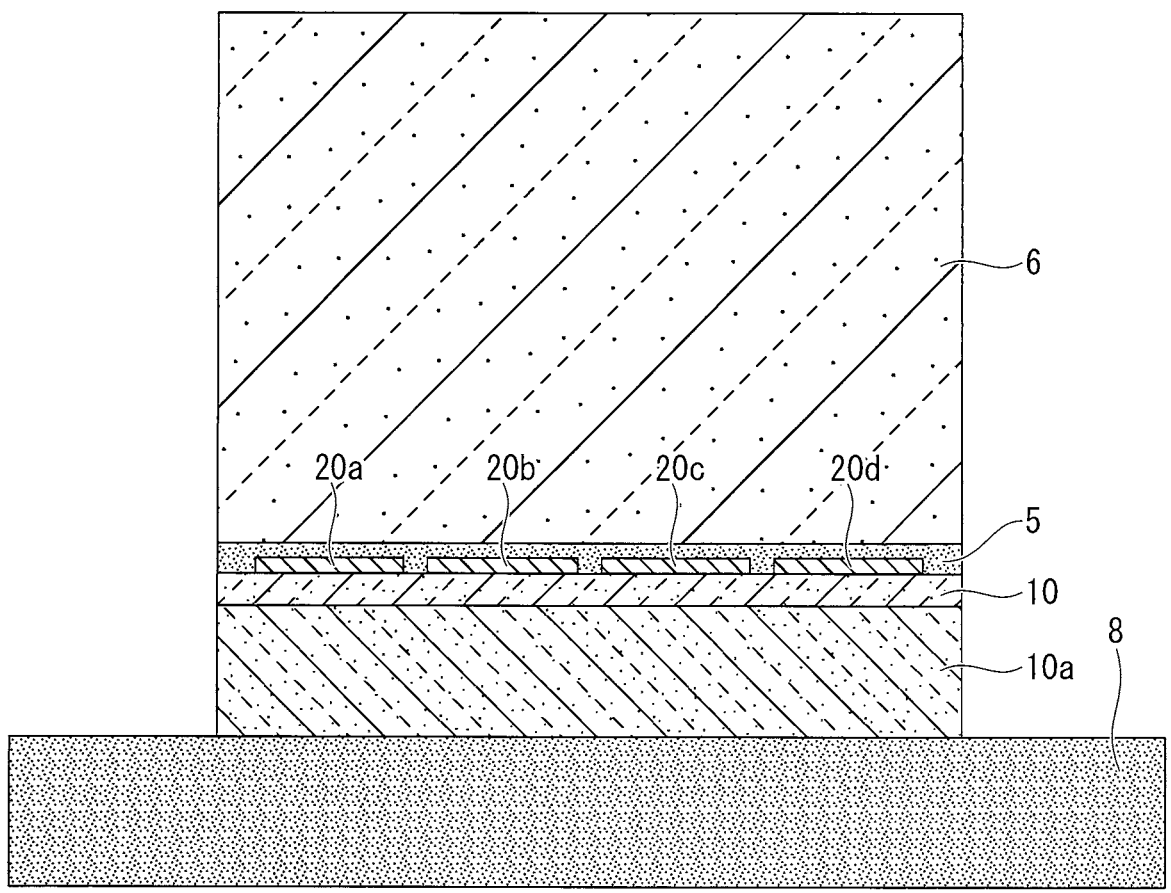
FIG. 15 is a process cross-sectional diagram illustrating the method of manufacturing the semiconductor device according to Comparative Example (No. 2)
Figure 16:
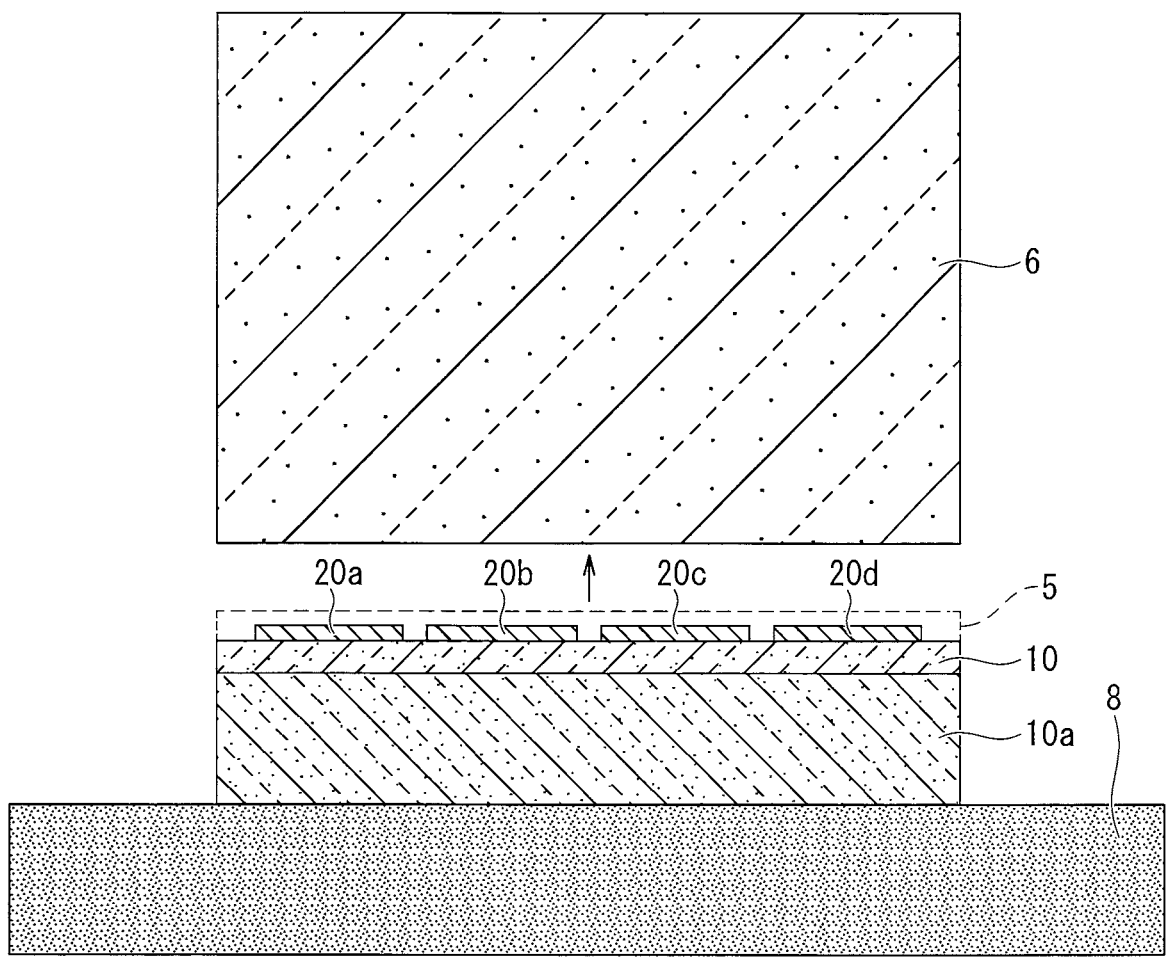
FIG. 16 is a process cross-sectional diagram illustrating the method of manufacturing the semiconductor device according to Comparative Example (No. 3)

Next, as illustrated in FIG. 15, after the surface of the SiC wafer 100 is adhered to the dicing tape 8, as illustrated in FIG. 16, the adhesive layer 5 is removed, and the top-surface supporting-substrate 6 is peeled off. And chips are created by dicing the SiC wafer 100.

In the case of the method of manufacturing the semiconductor device according to Comparative Example, in terms of securing the mechanical strength, the thickness of the bulk layer 10*a* cannot be allowed to become a predetermined thickness or less. Therefore, a drift layer of the semiconductor device cannot be thinned, and the transport time of carriers becomes long, and therefore, high-speed operation cannot be achieved. Furthermore, since the drift layer is thick, the resistance component cannot be sufficiently lowered, and therefore, the conduction loss is also large and fully utilizing the advantages of SiC is not possible.

By the method of manufacturing the semiconductor device pertaining to the first embodiment, after the SiC wafer 100, in which the device structures 20*a* to 20*d* are formed at the respective chip regions on the top surface of the SiC wafer 100, is thinned from the bottom surface of the SiC wafer 100, an Si semiconductor substrate which is easy to process as a bottom-surface supporting-substrate is bonded to the bottom surface. And, by processing the bottom-surface supporting-substrate made of Si, the support structure 30 is established at the bottom-surface side of the SiC wafer 100, so that the mechanical strength of the SiC wafer 100 is enhanced.

Next, by dicing the SiC wafer 100 in the state where the SiC wafer is merged with the support structure 30, a plurality of chips are gained. Although the SiC semiconductor substrate is thinned, the dicing process is possible without damaging good device performances, through the manufacturing processes, which includes the building up of the device structures 20*a* to 20*d*, thereafter, the thinning of the SiC wafer 100, and then, the joining of the bottom-surface supporting-substrate $30_{sub}$. After dicing, a chip having sufficient mechanical strength can be obtained even in a chip state.

In addition, by the method of manufacturing the semiconductor device pertaining to the first embodiment, the SiC semiconductor substrate and the bottom-surface supporting-substrate $30_{sub}$ made of Si are bonded at room temperature—low temperature bonding—, therefore, since any adhesive is not used, even after the bonding, a high temperature process is possible, for example, at a temperature of 1000° C. or more. Therefore, irregularity in the thickness of the semiconductor substrate will not occur, the thickness irregularity is caused by irregularity in the thickness of the adhesive coated on the bonding surface. In addition, problems such as the adhesive on the bonding surface is melted or denatured, due to the high-temperature process during the manufacturing of the semiconductor device, will not occur.

In addition, by the method of manufacturing the semiconductor device pertaining to the first embodiment, without lowering the bonding-strength, a sufficient conductivity can be secured, because the SiC semiconductor substrate and the bottom-surface supporting-substrate $30_{sub}$ made of Si are bonded to each other through the surface activation method, without using any oxide film. In addition, since the bonding surface is formed by substantially bulk or amorphous state, even in the anisotropic etching using potassium hydroxide (KOH) or the like, the bonding surface serves as a function of an etch stopper, therefore, any oxide film is not an essential requirement in the manufacturing of the semiconductor device. However, as illustrated in the sixth embodiment later with reference to FIG. 21, the present invention does not exclude an aspect where the SiC semiconductor substrate and the bottom-surface supporting-substrate $30_{sub}$ made of Si are bonded to each other through an insulating layer 13.

In addition, by the method of manufacturing the semiconductor device pertaining to the first embodiment, as the process-sequence order is sufficiently considered, the Si substrate can be used as the bottom-surface supporting-substrate $30_{sub}$ because the problem of the melting point of Si does not occur. Therefore, a Si substrate which is inexpensive and excellent in process capability can be used. Si is advantageous in etching behavior. Particularly, Si is advantageous in that the anisotropic etching or the like can be utilized.

In addition, in order to manufacture a semiconductor device by using only the SiC semiconductor substrate, without using the epitaxial growth process, the preparation of a SiC semiconductor substrate having a predetermined thickness is necessary when the bottom-surface supporting-substrate $30_{sub}$ is not available. Because a predetermined thickness of a layer required for the device structures 20*a* to 20*d*, a predetermined thickness of a peeling layer formed by implanting hydrogen ions as described in JP 2003-282845A, and a predetermined thickness as a processing margin for planarizing a roughened surface in the peeling are required respectively.

Particularly in the case of a complicated device such as a MOSFET where a plurality of p-type regions and n-type regions are stacked in combination, the thickness of the to-be-prepared SiC semiconductor substrate becomes relatively large, and the burden of the SiC semiconductor substrate is increased. Therefore, in the case where of manufacturing the semiconductor device by using only the SiC semiconductor substrate without using the bottom-surface supporting-substrate $30_{sub}$, a use efficiency of the material for the SiC semiconductor substrate is decreased, therefore, the cost is increased. In view of the above situation, only a semiconductor device having a structure as simple as a diode can be manufactured without using the bottom-surface supporting-substrate $30_{sub}$.

In addition, in accordance with the method disclosed in JP 2003-282845A, alignment markers shall be arranged on the peeled surface side, for the case when the planar patterns of the p-type and n-type regions are not simple, and/or, the device structures 20a to 20d are changed to be more complicated. Therefore, mask alignments in later scheduled manufacturing processes become difficult.

By the method of manufacturing the semiconductor device pertaining to the first embodiment, since the Si substrate is used as the bottom-surface supporting-substrate $30_{sub}$, the SiC epitaxial growth process can be facilitated. Therefore, even a SiC device having a complicated structure can be manufactured at a low cost with minimized burden of the processing.

In addition, as illustrated in FIG. 9B, because the SiC wafer 100 is merged with the support structure 30, an extremely thin film of about ten micrometers can have a sufficient mechanical strength, even under the condition that the SiC wafer 100 is peeled off from the support body 7, and therefore, the handling the SiC wafer 100 as a single body is easy. In addition, since the bottom-surface electrode 40 serving as the ohmic contact layer can be formed at a process temperature lower than the melting point of Si which is about 1414° C., the embodiment is particularly effective to the SiC to which formation of the ohmic contact layer is difficult.

Second Embodiment (Semiconductor Device)

Figure 17A:
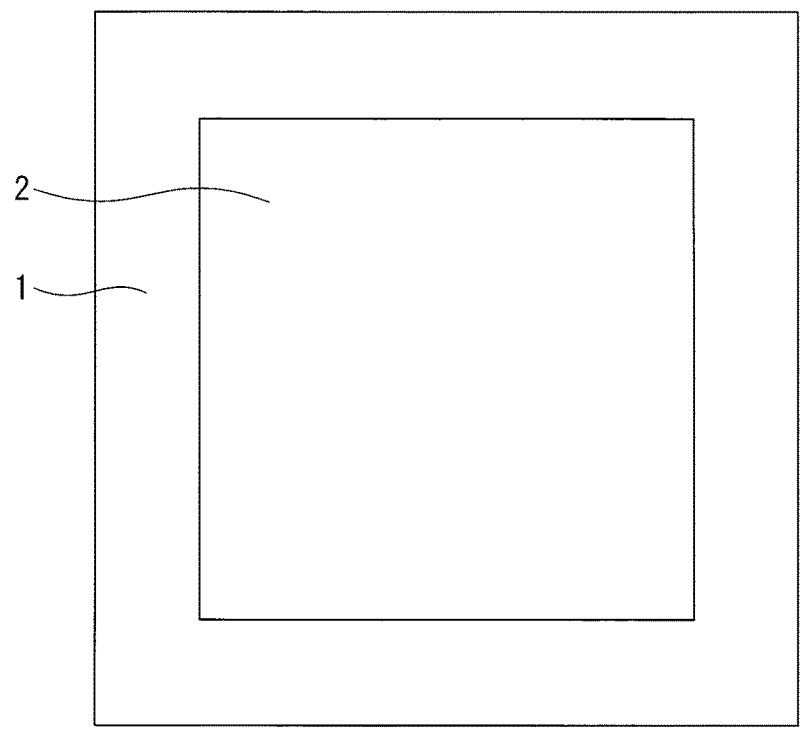
FIG. 17A is a schematic top view illustrating a configuration of a semiconductor device according to a third embodiment.
Figure 17B:
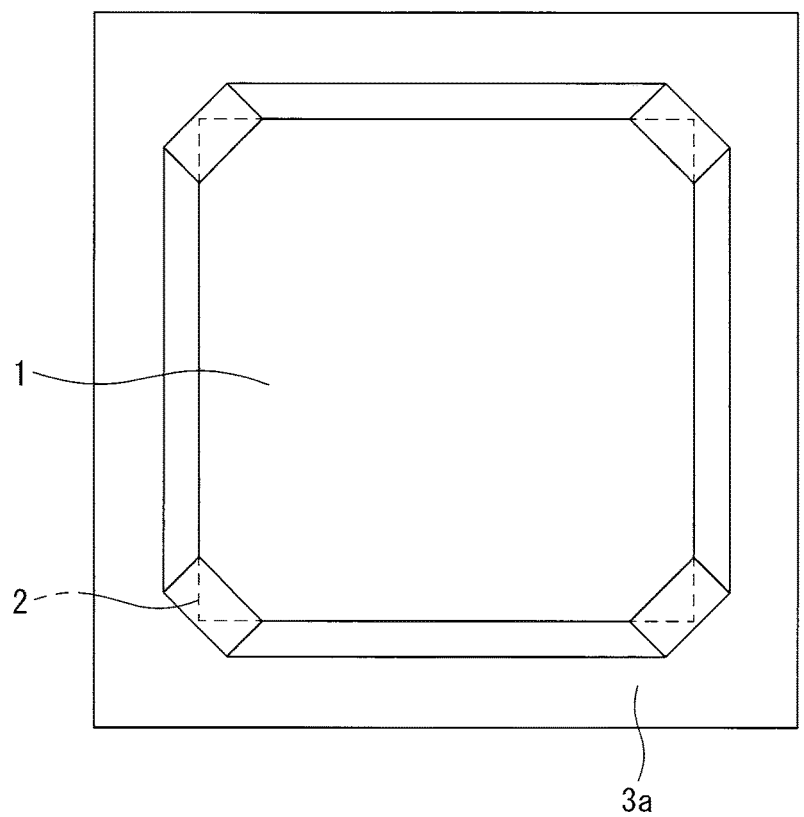
FIG. 17B is a schematic bottom view illustrating the configuration of the semiconductor device according to the third embodiment.

A semiconductor device according to a second embodiment illustrated in FIG. 17A includes an epitaxial-growth layer 1 mainly made of SiC and the device structures 2 provided on the epitaxial-growth layer 1. In addition, as illustrated in FIG. 17B, the semiconductor device according to the second embodiment further includes a supporting leg 3a selectively provided on a peripheral portion of a bottom surface of the epitaxial-growth layer 1 so that a central portion of the bottom surface is partially exposed.

As the planar pattern of the substantially square base of the top surface of the supporting leg 3a appears on the bottom surface of the epitaxial-growth layer 1, the semiconductor device according to the second embodiment is different from the semiconductor device according to the first embodiment in that the four corners of the planar pattern of the substantially square base have a taper shape. Since other structures of the semiconductor device according to the second embodiment are equivalent to the corresponding structures of the semiconductor device illustrated in FIGS. 1A, 1B and 2, respectively, the redundant description of the structures is omitted.

According to the semiconductor device according to the second embodiment, since the regions of the corners of the base of the supporting leg 3a on the bottom-surface side of the epitaxial-growth layer 1 side are secured to be larger than the regions of the corners of the base of the supporting leg 3 of the semiconductor device illustrated in FIG. 1B, enhancing the mechanical strength of the supporting leg 3a is possible. Other effectiveness of the semiconductor device according to the second embodiment are the same as the effectiveness of the semiconductor device according to the first embodiment.

(Method of Manufacturing Semiconductor Device)

The supporting leg 3a of the semiconductor device according to the second embodiment can be manufacturing by changing the to-be-etched region by modifying the shape of the resist mask in the process of cutting the recessed portion by processing the support structure 30 in the manufacturing method described with reference to FIGS. 3 to 12. Other technical effects of the method of manufacturing the semiconductor device according to the second embodiment are the same as the effectiveness of the method of manufacturing the semiconductor device according to the first embodiment.

Third Embodiment (Semiconductor Device)

Figure 18A:
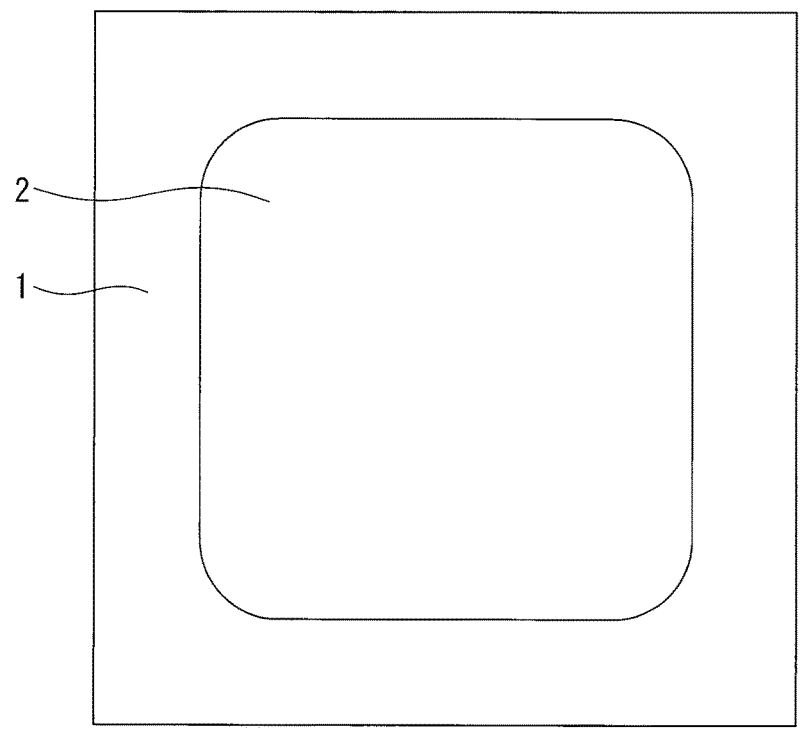
FIG. 18A is a schematic top view illustrating the configuration of the semiconductor device according to the third embodiment.
Figure 18B:
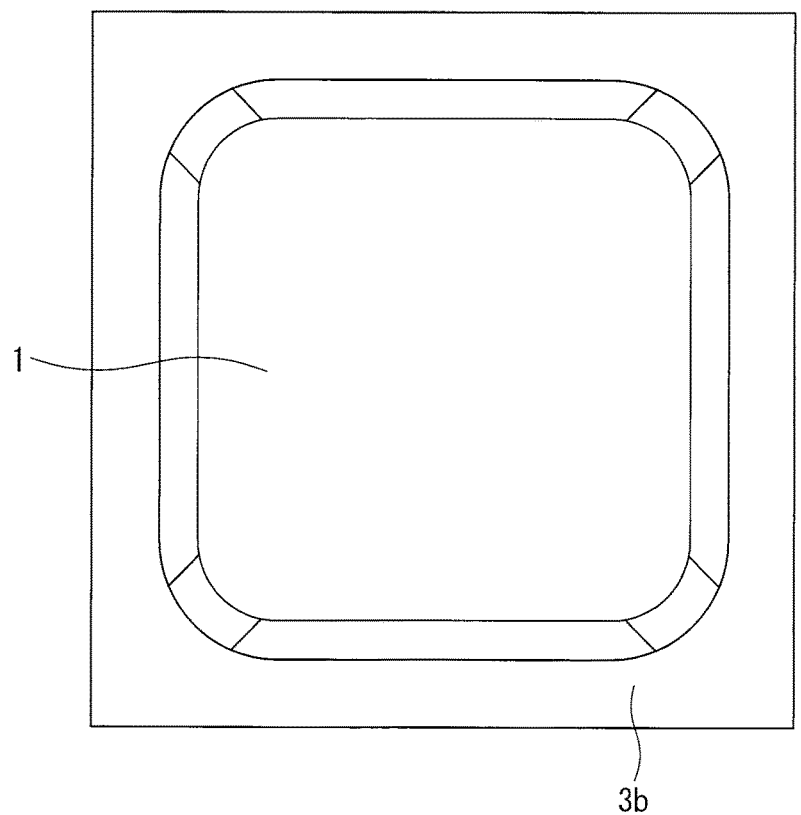
FIG. 18B is a schematic bottom view illustrating the configuration of the semiconductor device according to the third embodiment.

As illustrated in FIG. 18A, a semiconductor device according to a third embodiment includes an epitaxial-growth layer 1 mainly made of SiC and the device structures 2 provided on the epitaxial-growth layer 1. In addition, as illustrated in FIG. 18B, the semiconductor device according to the third embodiment further includes a supporting leg 3b selectively provided on a peripheral portion of a bottom surface of the epitaxial-growth layer 1 so that a central portion of the bottom surface is partially exposed.

Although the planar pattern of the substantially square base of the top surface of the supporting leg 3b appears on the bottom surface of the epitaxial-growth layer 1, the semiconductor device according to the third embodiment is different from the semiconductor device according to the first embodiment in that the four corners of the planar pattern of the substantially square base have an R shape, which is a smooth fan-like arc. Since other structures of the semiconductor device according to the third embodiment are equivalent to the corresponding structures of the semiconductor device illustrated in FIGS. 1A, 1B and 2, respectively, the redundant description of the structures is omitted.

According to the semiconductor device according to the third embodiment, since the regions of the corners of the base of the supporting leg 3b on the bottom-surface side of the epitaxial-growth layer 1 side are secured to be larger than the regions of the corners of the base of the supporting leg 3 of the semiconductor device illustrated in FIG. 1B, enhancing the mechanical strength of the supporting leg 3b is possible. Other technical effects of the semiconductor device according to the third embodiment are the same as the effectiveness of the semiconductor device according to the first embodiment.

(Method of Manufacturing Semiconductor Device)

Similarly to the method of manufacturing the semiconductor device according to the second embodiment, the supporting leg 3b of the semiconductor device according to the third embodiment can be manufacturing by changing the to-be-etched region by modifying the shape of the resist mask at the time of cutting the recessed portion by processing the support structure 30. The effectiveness of the method of manufacturing the semiconductor device according to the third embodiment are the same as the effectiveness of the method of manufacturing the semiconductor device according to the first embodiment.

Fourth Embodiment (Semiconductor Device)

Figure 19:
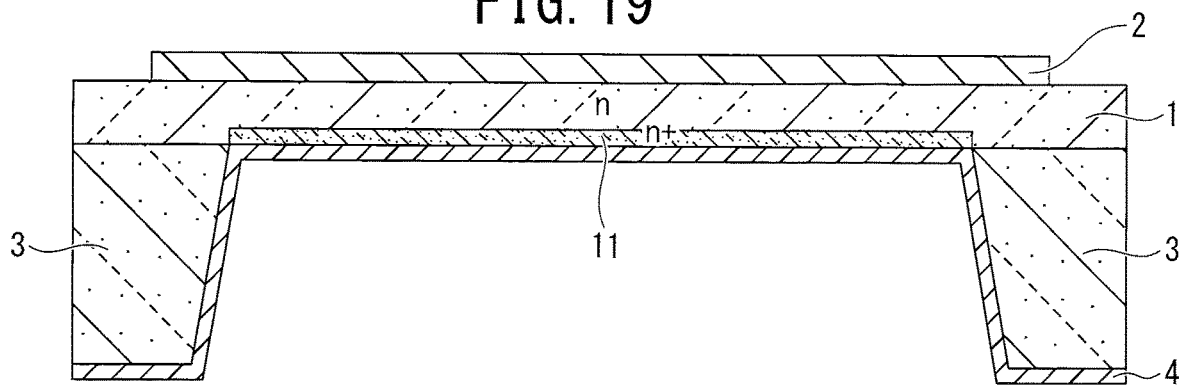
FIG. 19 is a schematic cross-sectional diagram illustrating a configuration of a semiconductor device according to a fourth embodiment.

As illustrated in FIG. 19, a semiconductor device according to a fourth embodiment includes an epitaxial-growth layer 1 mainly made of SiC and a device structure 2 provided on the epitaxial-growth layer 1. In addition, the semiconductor device according to the fourth embodiment includes a supporting leg 3 selectively provided on a peripheral portion of a bottom surface of the epitaxial-growth layer 1 so that a central portion of the bottom surface is partially exposed, and a bottom-surface electrode 4 which is laminated over the bottom surface of the epitaxial-growth layer 1 and the bottom surface of the supporting leg 3.

A high-concentration $n^+$-type contact region 11 is provided in the region which is in contact with the bottom surface exposed in the inside of the supporting leg 3 under the epitaxial-growth layer 1. Since other structures of the semiconductor device according to the fourth embodiment are equivalent to the corresponding structures of the semiconductor device illustrated in FIGS. 1A, 1B and 2, respectively, the redundant description of the structures is omitted.

According to the semiconductor device according to the fourth embodiment, since the contact region 11 is formed, manufacturing of a semiconductor device such as a MOSFET with reduced contact resistance at a bottom surface is possible. Other technical effects of the semiconductor device according to the fourth embodiment are the same as the effectiveness of the semiconductor device according to the first embodiment.

(Manufacturing Method)

The contact region 11 of the semiconductor device according to the fourth embodiment can be formed by implantation of n-type impurity-ions on the bottom of the recessed portion, and by local-position annealing process of the implanted ions, after the process for building the support structure 30 by the method of manufacturing the semiconductor device according to the first embodiment. The implanted impurity-elements are activated by the local-position annealing. The ion-implantation and the local-position annealing for forming the contact region 11 are performed under a low temperature condition at the melting point of Si or less. In addition, in view of the thickness of the contact region 11 which is scheduled to be formed in later process step, a portion of the bulk layer 10a can be left in the process of removing the bulk layer 10a illustrated in FIG. 5.

By the method of manufacturing the semiconductor device pertaining to the fourth embodiment, manufacturing a semiconductor device such as a MOSFET with reduced contact resistance at a bottom surface is possible. Other technical effects of the method of manufacturing the semiconductor device according to the fourth embodiment are the same as the effectiveness of the method of manufacturing the semiconductor device according to the first embodiment.

Fifth Embodiment (Semiconductor Device)

Figure 20:
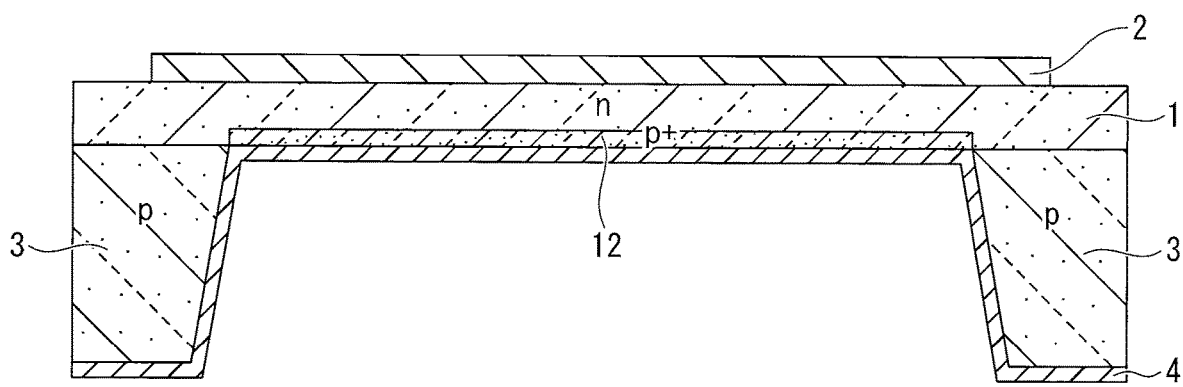
FIG. 20 is a schematic cross-sectional diagram illustrating a configuration of a semiconductor device according to a fifth embodiment.

As illustrated in FIG. 20, a semiconductor device according to a fifth embodiment includes an epitaxial-growth layer 1 mainly made of SiC and a device structure 2 provided on the epitaxial-growth layer 1. In addition, the semiconductor device according to the fifth embodiment includes a supporting leg 3 selectively provided on a peripheral portion of a bottom surface of the epitaxial-growth layer 1 so that a central portion of the bottom surface is partially exposed, and a bottom-surface electrode 4, which is laminated over the bottom surface of the epitaxial-growth layer 1 and the bottom surface of the supporting leg 3.

A high-concentration $p^+$-type contact region 12 is provided in the region which is in contact with the bottom surface exposed in the inside of the supporting leg 3 under the epitaxial-growth layer 1. In addition, Si of the supporting leg 3 is of a p-type. Since other structures of the semiconductor device according to the fourth embodiment are equivalent to the corresponding structures of the semiconductor device illustrated in FIGS. 1A, 1B and 2, respectively, the redundant description of the structures is omitted.

By the semiconductor device pertaining to the fourth embodiment, since the contact region 12 of reduced contact resistance can be formed at the bottom surface, it is possible to manufacture an IGBT by using the contact region 12 as "a collector region". Other technical effects of the semiconductor device according to the fifth embodiment are the same as the effectiveness of the semiconductor device according to the first embodiment.

(Manufacturing Method)

As a method of forming the contact region 12 of the semiconductor device according to the fifth embodiment, first, the support structure 30 is formed by the method of manufacturing the semiconductor device according to the first embodiment, and p-type impurity-ions are implanted into the bottom of the recessed portion. Next, by a process for activating the implanted impurity-ions through local-position annealing, the contact region 12 can be formed. In addition, as the bottom-surface supporting-substrate $30_{sub}$ serving as the support structure 30, p-type Si is used, and similarly to the case of the semiconductor device illustrated in FIG. 19, the ion-implantation and the local-position annealing for forming the contact region 11 are executed under a low temperature condition.

By the method of manufacturing the semiconductor device pertaining to the fifth embodiment, manufacturing a semiconductor device such as MOSFET with reduced contact resistance at a bottom surface is possible. Other technical effects of the method of manufacturing the semiconductor device according to the fourth embodiment are the same as the effectiveness of the method of manufacturing the semiconductor device according to the first embodiment.

Sixth Embodiment (Semiconductor Device)

Figure 21:
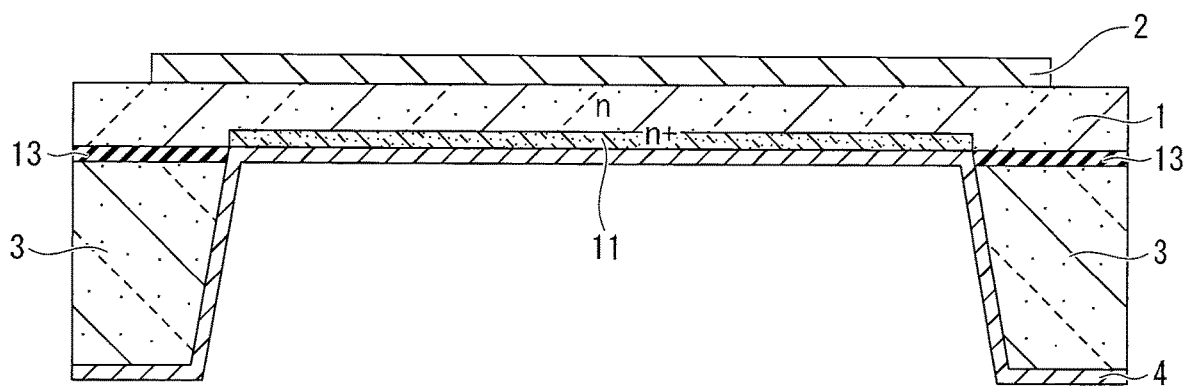
FIG. 21 is a schematic cross-sectional diagram illustrating a configuration of a semiconductor device according to a sixth embodiment.

As illustrated in FIG. 21, a semiconductor device according to a sixth embodiment includes an epitaxial-growth layer 1 mainly made of SiC and a device structure 2 provided on the epitaxial-growth layer 1. In addition, the semiconductor device according to the sixth embodiment includes a supporting leg 3 selectively provided on a peripheral portion of a bottom surface of the epitaxial-growth layer 1 so that a central portion of the bottom surface is partially exposed and a bottom-surface electrode 4, which is laminated over the bottom surface of the epitaxial-growth layer 1 and the bottom surface of the supporting leg 3.

A high-concentration $n^+$-type contact region 11 is provided in the region which is in contact with the bottom surface exposed in the inside of the supporting leg 3 under the epitaxial-growth layer 1. In addition, an insulating layer 13 is provided between the epitaxial-growth layer 1 and the supporting leg 3. The insulating layer 13 is provided at a position of the base of the supporting leg 3 so as not to overlap the active areas of the device structures 20a to 20d in the vertical direction. Since other structures of the semiconductor device according to the fourth embodiment are equivalent to the corresponding structures of the semiconductor device illustrated in FIGS. 1A, 1B and 2, respectively, the redundant description of the structures is omitted.

By the semiconductor device pertaining to the sixth embodiment, sine the insulating layer 13 is provided between the epitaxial-growth layer 1 and the supporting leg 3, suppressing electric influences caused by defects of the bonding interface between the epitaxial-growth layer 1 and the supporting leg 3 is possible. Other technical effects of the semiconductor device according to the sixth embodiment are the same as the effectiveness of the semiconductor device according to the fourth embodiment.

(Manufacturing Method)

As a method of forming the insulating layer 13 of the semiconductor device according to the sixth embodiment, first, oxygen gas ($O_2$) is added in the surface treatments for the bonding of SiC wafer 100 and the bottom-surface supporting-substrate $30_{sub}$, which is recited in the method of manufacturing the semiconductor device according to the fourth embodiment. Accordingly, an insulating film of an oxide film —$SiO_2$— is formed at the bonding interface. The insulating layer 13 can be provided from the remaining part of the insulating film, by partially etching the insulating film together with the support structure 30, when an opening portion of the recessed portion is dug for implementing the support structure 30.

By the method of manufacturing the semiconductor device pertaining to the sixth embodiment, manufacturing a semiconductor device capable of suppressing electric influences caused by defects of the bonding interface between the epitaxial-growth layer 1 and the supporting leg 3 is possible. Other technical effects of the method of manufacturing the semiconductor device according to the sixth embodiment are the same as the effectiveness of the semiconductor device according to the fourth embodiment.

OTHER EMBODIMENTS

While the present invention is described with reference to the above first to sixth embodiments, it should not be understood that the description and drawings serving as a part of the disclosure limit the scope of the present invention. It should be considered from the disclosure that various alternative embodiments, examples, and operation techniques are apparent to the ordinarily skilled in the art.

For example, the structures illustrated in FIGS. 1 to 21 may be combined. In addition, a material of the epitaxial-growth layer 10 or the bulk layer 10a are not limited to SiC material, but the present invention can also be applied to other materials of wide bandgap semiconductors. As described above, the present invention includes various embodiments and the like which are not described above, and the technical scope of the present invention is defined only by the "matter specifying the invention" according to the claims which are reasonable from the above description.

What is claimed is:

1. A method of manufacturing a semiconductor device, comprising:

assigning a plurality of chip regions on an epitaxial-growth layer of a semiconductor substrate, the semiconductor substrate further comprising a bulk layer on which the epitaxial-growth layer has been grown, the bulk layer having a bottom-surface side facing away from the epitaxial-growth layer;

forming a plurality of device structures on the plurality of chip regions, respectively;

bonding an upper supporting-substrate on a top-surface side of the epitaxial-growth layer;

after bonding the upper supporting-substrate on the top-surface side of the epitaxial-growth layer, thinning the semiconductor substrate from the bottom-surface side of the bulk layer by removing the bulk layer from the semiconductor substrate and exposing a bottom-surface side of the epitaxial-growth layer;

bonding a lower supporting-substrate on the bottom-surface side of the epitaxial-growth layer exposed by the thinning;

after bonding the lower supporting-substrate on the bottom-surface side of the epitaxial-growth layer exposed by the thinning, thinning a bottom-surface side of the lower supporting-substrate;

after thinning the bottom-surface side of the lower supporting-substrate, selectively removing portions of the thinned lower supporting-substrate so that portions of the bottom-surface side of the epitaxial-growth layer are exposed, at locations corresponding to positions of each of main current paths in the plurality of device structures, respectively;

after selectively removing the portions of the thinned lower supporting-substrate, adhering a bottom surface of the thinned lower supporting-substrate to an adhesive tape;

applying heat or ultraviolet radiation to neutralize an adhesive force of an adhesive layer which bonds the upper supporting-substrate to the top-surface side of the epitaxial-growth layer, and separating the upper supporting-substrate from the top-surface side of the epitaxial-growth layer while the bottom surface of the thinned lower supporting-substrate is adhered to the adhesive tape;

applying heat or ultraviolet radiation to neutralize an adhesive force of the adhesive tape and separating the bottom surface of the thinned lower supporting-substrate from the adhesive tape; and dicing the thinned semiconductor substrate having the bulk layer removed, together with the lower supporting-substrate, along dicing lanes between the plurality of the chip regions so as to form a plurality of chips.

2. The method of claim 1, wherein a material of at least one of the epitaxial-growth layer or the bulk layer is a wide bandgap semiconductor material.

3. The method of claim 2, wherein the material of at least one of the epitaxial-growth layer or the bulk layer is silicon carbide.

4. The method of claim 1, wherein a material of the lower supporting-substrate is a semiconductor material different from that of the bulk layer.

5. The method of claim 4, wherein the lower supporting-substrate is a single crystalline silicon substrate.

6. The method of claim 1,
wherein
the selectively removing the portions of the thinned lower supporting-substrate includes selective etching such that inclined recesses in the lower supporting-substrate are formed.

7. The method of claim 1, wherein the selectively removing the portions of the thinned lower supporting-substrate is executed by anisotropic etching.

8. The method of claim 1, further comprising, after separating the bottom surface of the thinned lower supporting-substrate from the adhesive tape, forming a bottom-surface electrode by forming an ohmic contact layer on a bottom-surface side of remaining portions of the thinned lower supporting-substrate and on the portions of the bottom-surface side of the epitaxial-growth layer exposed by the selectively removing, and forming a silicide of the ohmic contact layer.

9. The method of claim 8, wherein the forming the ohmic contact layer is performed at a temperature of 500° C. or more and a melting point of silicon or less.

10. The method of claim 8, wherein the ohmic contact layer comprises at least one of nickel, titanium, aluminum, molybdenum, and chromium.

11. The method of claim 1, wherein a material used in the forming the plurality of the device structures has a melting point being higher than any one of the highest temperatures reachable in the bonding the lower supporting-substrate and the selectively removing the portions of the thinned lower supporting-substrate.

12. The method of claim 1, wherein the bonding the lower supporting-substrate is performed by activating a bonding surface of the epitaxial-growth layer exposed by the thinning and a bonding surface of the lower supporting-substrate.

13. The method of claim 12, wherein the activating the bonding surfaces is performed by plasma, gas, or beam.

14. The method of claim 1, wherein the bonding the lower supporting-substrate is a direct bonding of the epitaxial-growth layer exposed by the thinning and the lower supporting-substrate.

15. The method of claim 1, wherein the bonding is performed by:
forming an intermediate layer on a bonding surface of at least one of the epitaxial-growth layer exposed by the thinning and the lower supporting-substrate, and
bonding the epitaxial-growth layer exposed by the thinning and the lower supporting-substrate through the intermediate layer.

16. The method of claim 15, wherein the intermediate layer is a layer containing water molecules having a thickness at molecular layer level.

17. The method of claim 1, wherein
the selectively removing the portions of the lower supporting-substrate forms a supporting leg which encloses a recessed portion where a bottom-surface side of the recessed portion corresponds to the portions of the bottom-surface side of the epitaxial-growth layer which are exposed by the selectively removing, and
an active area of a corresponding device structure is arranged only in an inside of a first region having an outer edge at a position separated by a thickness of the epitaxial-growth layer inwards from an inner edge of a second region occupied by the bottom-surface side of the recessed portion.

18. The method of claim 17, wherein a breakdown-voltage improving-structure is provided around the active area.

19. The method of claim 1,
wherein
the selectively removing the portions of the thinned lower supporting-substrate includes selective etching such that inclined recesses in the lower supporting-substrate are formed,
locations of the inclined recesses formed in the lower supporting-substrate correspond to locations of the plurality of device structures and to locations where the portions of the bottom-surface side of the epitaxial-growth layer are exposed,
a width of each portion of the bottom-surface side of the epitaxial-growth layer exposed by the selectively removing is less than a width of a corresponding device structure formed on a corresponding chip region, and
a width of an active area of each device structure is less than the width of each portion of the bottom-surface side of the epitaxial-growth layer exposed by the selectively removing.

* * * * *